(12) United States Patent
Ishii

(10) Patent No.: US 10,587,181 B2
(45) Date of Patent: Mar. 10, 2020

(54) POWER SEMICONDUCTOR DEVICE WITH BUILT-IN RESISTOR BETWEEN CONTROL ELECTRODE AND CONTROL TERMINAL, AND POWER SEMICONDUCTOR DRIVE SYSTEM

(71) Applicant: MITSUBISHI ELECTRIC CORPORATION, Tokyo (JP)

(72) Inventor: Kazufumi Ishii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/899,596

(22) Filed: Feb. 20, 2018

(65) Prior Publication Data

US 2018/0309386 A1  Oct. 25, 2018

(30) Foreign Application Priority Data

Apr. 25, 2017 (JP) ................. 2017-086207

(51) Int. Cl.
*H02M 1/084* (2006.01)

(52) U.S. Cl.
CPC .... *H02M 1/084* (2013.01); *H03K 2217/0009* (2013.01)

(58) Field of Classification Search
CPC ... H03K 2217/0009; H03K 2217/0063; H03K 2217/0072; H03K 3/0375; H02M 1/08; H02M 1/084

(Continued)

(56) References Cited

U.S. PATENT DOCUMENTS 6,222,355 B1 *  4/2001  Ohshima ............ H03K 17/0822
                                                    323/282
9,813,009 B1 * 11/2017  Xu ......................... B60L 50/51
(Continued)

FOREIGN PATENT DOCUMENTS

CN       108400721 A     8/2018
JP     2012-120304 A     6/2012
(Continued)

OTHER PUBLICATIONS

An Office Action mailed by the State Intellectual Property Office of the People's Republic of China dated Nov. 5, 2019, which corresponds to Chinese Patent Application No. 201810380225.2 and is related to U.S. Appl. No. 15/899,596.

(Continued)

*Primary Examiner* — Kyle J Moody
*Assistant Examiner* — Peter M Novak
(74) *Attorney, Agent, or Firm* — Studebaker & Brackett PC

(57) ABSTRACT

Each of a plurality of semiconductor elements is provided with a first control terminal and a second control terminal. A built-in gate resistor is connected between the semiconductor element and the first control terminal. Individual voltage pulse signals are input to the second control terminals when the plurality of semiconductor elements are individually turned on and off. A common voltage pulse signal is input to some of the first control terminals when a first group of semiconductor elements is turned on and off in common. A common voltage pulse signal is input to others of the first control terminals when a second group of semiconductor elements is turned on and off in common.

14 Claims, 17 Drawing Sheets

(58) Field of Classification Search
USPC .............................. 315/307–311, 209 CD, 56
See application file for complete search history.

(56) References Cited

U.S. PATENT DOCUMENTS

| | | | |
|---|---|---|---|
| 2011/0241589 A1* | 10/2011 | Danjo ..................... | B60L 3/003 |
| | | | 318/453 |
| 2012/0134181 A1 | 5/2012 | Amano et al. | |
| 2017/0033721 A1 | 2/2017 | Chai | |
| 2017/0237362 A1* | 8/2017 | Sasaki ..................... | H02M 1/08 |
| | | | 363/98 |
| 2018/0159440 A1* | 6/2018 | Xu .......................... | H02M 1/32 |

FOREIGN PATENT DOCUMENTS

| | | | |
|---|---|---|---|
| JP | 2013055822 A | * | 3/2013 |
| JP | 2017011007 A | | 1/2017 |

OTHER PUBLICATIONS

An Office Action mailed by the German Patent and Trade Mark Office dated Dec. 12, 2019, which corresponds to German Patent Application No. DE102018205281.6.
Mitsubishi Electric Corporation—CM100TX-24S, Tokyo, JP, 2014.
Mitsubishi Electric Corporation—CM100RX-24S Tokyo, JP, 2013.
English Translation of an Office Action mailed by the State Intellectual Property Office of the Peoples Republic of China dated Nov. 5, 2019, which corresponds to Chinese Patent Application No. 201810380225.2.
English Translation of an Office Action mailed by the German Patent and Trade Mark Office dated Dec. 12, 2019, which corresponds to German Patent Application No. DE102018205281.6.

* cited by examiner

--Prior Art--

POWER SEMICONDUCTOR DEVICE WITH BUILT-IN RESISTOR BETWEEN CONTROL ELECTRODE AND CONTROL TERMINAL, AND POWER SEMICONDUCTOR DRIVE SYSTEM

BACKGROUND OF THE INVENTION

Field of the Invention

This invention relates to a power semiconductor device and a power semiconductor drive system and more particularly to a semiconductor device containing a plurality of semiconductor elements and a system for driving the same.

Description of the Background Art

Japanese Patent Laying-Open No. 2012-120304 describes an inverter module containing six power transistors as a semiconductor device containing a plurality of semiconductor elements.

SUMMARY OF THE INVENTION

A three-phase inverter is configured such that a semiconductor element defined as an upper arm and a semiconductor element defined as a lower arm in each of a U phase, a V phase, and a W phase are connected in series between power supply lines with an output terminal in each phase being interposed.

Therefore, when output terminals are connected to one another among the plurality of phases, the elements in the upper arm and the elements in the lower arm in the plurality of phases are electrically connected in parallel to one another. By turning on and off the plurality of semiconductor elements connected in parallel in common, the plurality of semiconductor elements can be used as a single semiconductor switching element. For example, six semiconductor elements which implement a three-phase inverter can be used as a half bridge inverter by turning on and off in common each set of three semiconductor elements connected in parallel by interconnecting output terminals in the U phase, the V phase, and the W phase.

In such manner of use, however, an LC resonance circuit is formed by a stray inductance and a parasitic capacitance on a path from a drive device to a control electrode (gate) among the plurality of semiconductor elements connected in parallel. Furthermore, due to a difference in length of a line attributed to variation in manufacturing or a layout, such a configuration of the LC resonance circuit that imbalanced LC components are connected in parallel is concerned.

When it becomes difficult to control in unison, voltages at control electrodes (gates) of a plurality of semiconductor elements connected in parallel due to a resonance phenomenon in the LC resonance circuit, a current which flows through each semiconductor element becomes non-uniform and disadvantageous occurrence of concentration of heat generation in a specific semiconductor element is concerned.

The present disclosure was made to solve such problems, and an object thereof is to provide a configuration for balancing a current in each semiconductor element in such a manner of use that semiconductor elements are connected in parallel and turned on and off in common in a semiconductor device containing a plurality of semiconductor elements.

In one aspect of the present disclosure, a power semiconductor device includes a plurality of first phase circuits connected in parallel between first and second power supply lines. Each of the plurality of first phase circuits includes first and second semiconductor elements. The first and second semiconductor elements are connected in series between the first and second power supply lines with a first output node being interposed. The first and second semiconductor elements each include a control electrode and first and second main electrodes and are configured such that the first and second main electrodes are rendered conducting or non-conducting in accordance with a voltage at the control electrode. The power semiconductor device further includes first and second control terminals for input of an electrical signal from the outside of the power semiconductor device. The first and second control terminals are provided in correspondence with each of the first and second semiconductor elements in each of the plurality of first phase circuits. The first and second control terminals are electrically connected to the control electrode of a corresponding semiconductor element of the first and second semiconductor elements. The power semiconductor device further includes a first built-in resistor electrically connected between the first control terminal and the control electrode in each of the plurality of first phase circuits.

According to the power semiconductor device, in the first and second semiconductor elements in each of the first phase circuits, with arrangement of a resistor built-in in a gate, an electrical resistance value between the first control terminal and the control electrode can be higher than an electrical resistance value between the second control terminal and the control electrode. Therefore, when the first and second semiconductor elements are connected in parallel and controlled in common among the plurality of first phase circuits, an electrical signal for turning on and off the first or second semiconductor element is input to the first control terminal so that a phenomenon of resonance of a gate voltage can be suppressed without connecting a resistive element with an external line, and hence a difference in current caused between the plurality of first or second semiconductor elements connected in parallel due to a difference in gate voltage can be suppressed. When the first and second semiconductor elements are individually controlled among the plurality of phase circuits, an electrical signal for turning on and off the first and second semiconductor elements is input to the second control terminal so that a gate resistance can be suppressed and switching loss can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
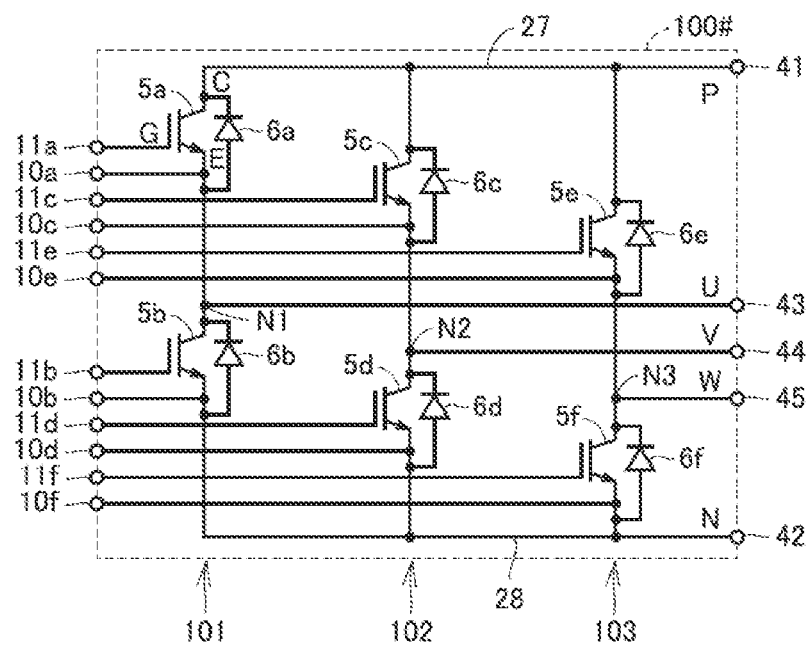
FIG. 1 is a circuit diagram illustrating a configuration of a power semiconductor device according to a comparative example.

Embodiments of the present invention will be described below in detail with reference to the drawings. The same or corresponding elements in the drawings below have the same reference characters allotted and description thereof will not be repeated in principle.

First Embodiment

In the present embodiment, a power semiconductor device mainly for an application as a power conversion device in which a plurality of circuits each corresponding to one phase and constituted of an upper arm and a lower arm connected in series are provided will be described. In particular, a configuration of the power semiconductor device suitable for selective use in a manner that each phase circuit is individually operated and a manner that the upper arm and the lower arm are each operated in common with circuits in a plurality of phases being connected in parallel will be described in detail.

Though a plurality of semiconductor elements contained in a power semiconductor device will be described in the present embodiment assuming that one semiconductor element is arranged for each arm, each semiconductor element can also actually be configured by connecting a plurality of semiconductor elements in parallel.

Comparative Example

A configuration of a general power semiconductor device containing a plurality of semiconductor elements will initially be described as a comparative example.

FIG. 1 is a circuit diagram illustrating a configuration of a power semiconductor device 100# according to a comparative example. Referring to FIG. 1, power semiconductor device 100# is configured as a module containing a plurality of semiconductor elements 5a to 5f. For example, each of semiconductor elements 5a to 5f is implemented by an insulated gate bipolar transistor (IGBT) and turned on and off in response to an electrical signal from the outside of power semiconductor device 100#. When semiconductor elements 5a to 5f are implemented by IGBTs, freewheeling diodes 6a to 6f for ensuring a current path while the semiconductor element is turned off are connected in antiparallel to semiconductor elements 5a to 5f, respectively.

Semiconductor elements 5a to 5f are connected to implement a U-phase circuit 101, a V-phase circuit 102, and a W-phase circuit 103. U- to W-phase circuits 101 to 103 each have two semiconductor elements connected in series, with respective output nodes N1 to N3 being interposed, between a power supply line 27 connected to a high power supply terminal 41 and a power supply line 28 connected to a low power supply terminal 42. Each of the two semiconductor elements controlled to turn on and off implements an arm, together with the freewheeling diode. Power supply line 27 corresponds to the "first power supply line" and power supply line 28 corresponds to the "second power supply line."

U-phase circuit 101 has semiconductor elements 5a and 5b connected in series with output node N1 being interposed, between power supply lines 27 and 28. Similarly, V-phase circuit 102 has semiconductor elements 5c and 5d connected in series with output node N2 being interposed, between power supply lines 27 and 28. W-phase circuit 103 has semiconductor elements 5e and 5f connected in series with output node N3 being interposed, between power supply lines 27 and 28. Output nodes N1 to N3 are electrically connected to output terminals 43 to 45, respectively. Semiconductor elements 5a, 5c, and 5e implement the "upper arm" of U- to W-phase circuits 101 to 103 and semiconductor elements 5b, 5d, and 5f implement the "lower arm" of U- to W-phase circuits 101 to 103.

Each of semiconductor elements 5a to 5f is configured such that main electrodes are rendered conducting or non-conducting in accordance with a voltage or a current at the control electrode. For example, each of semiconductor elements 5a to 5f implemented by IGBTs has a collector (C) and an emitter (E) rendered conducting or non-conducting in accordance with a voltage at a gate (G) (hereinafter also referred to as a "gate voltage") with respect to the emitter (E).

Control terminals 11a to 11f electrically connected to the control electrodes (gates in the example in FIG. 1) are provided in correspondence with semiconductor elements 5a to 5f, respectively. Terminals 10a to 10f electrically connected to one of the main electrodes (the emitter in the example in FIG. 1) are arranged in correspondence with semiconductor elements 5a to 5f, respectively. Terminals 10a to 10f and control terminals 11a to 11f can electrically be in contact from the outside of power semiconductor device 100#.

Therefore, an electrical signal for controlling turn on and off of semiconductor elements 5a to 5f constituting the arms can be input to control terminals 11a to 11f from the outside of power semiconductor device 100#. The electrical signal can be a voltage pulse signal set to a voltage level different between an on period and an off period of a semiconductor element.

Thus, each of semiconductor elements 5a to 5f is turned on and off from the outside of power semiconductor device 100# by controlling a voltage at the control electrode (gate) (hereinafter simply also referred to as a "gate voltage") with respect to one of the main electrodes (emitter) with an electrical signal (voltage pulse signal) input to control terminals 11a to 11f.

When semiconductor elements 5a to 5f are comprehensively described below, they are also simply denoted as semiconductor element 5. Similarly, other elements are denoted with suffixes a to f when correspondence with semiconductor elements 5a to 5f is to be clarified, whereas when it is not necessary to specify correspondence with a semiconductor element, the elements are comprehensively denoted only with a number.

Figure 2:
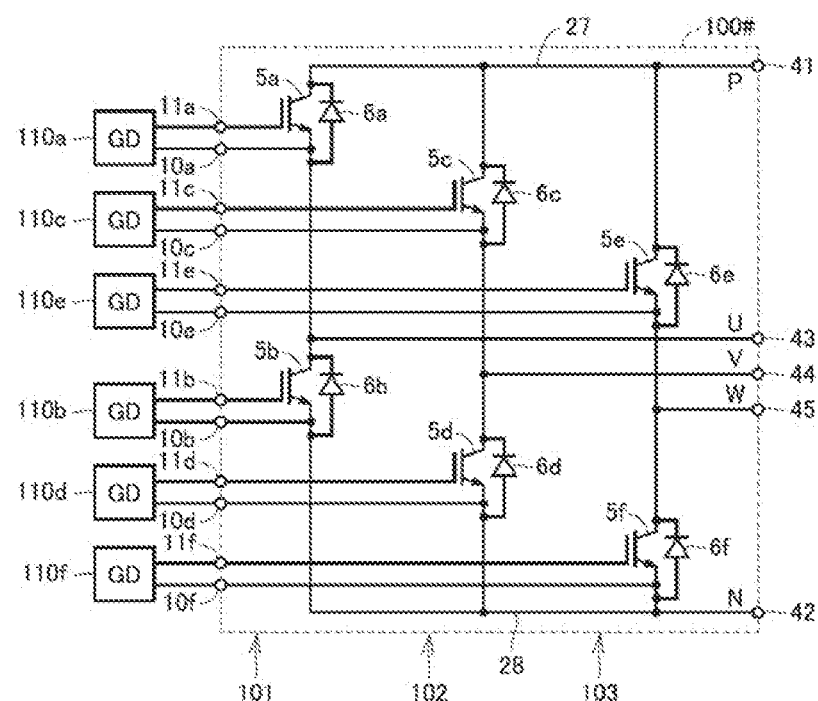
FIG. 2 is a circuit diagram illustrating a state of line connection in a first manner of use (individual use) of the power semiconductor device shown in FIG. 1.

FIG. 2 shows exemplary arrangement of a drive device in a first manner of use (individual use) of power semiconductor device 100#.

Referring to FIG. 2, drive devices 110a to 110f are arranged in correspondence with semiconductor elements 5a to 5f, respectively. Drive device 110a inputs a voltage pulse signal for controlling a voltage across terminal 10a and control terminal 11a (that is, a gate voltage of semiconductor element 5a) to control terminal 111a of semiconductor element 5a.

Similarly, drive devices 110b to 110f are connected to terminals 10b to 10f and control terminals 11b to 11f of semiconductor elements 5b to 5f and input voltage pulse signals for controlling gate voltages of semiconductor elements 5b to 5f to control terminals 11b to 11f, respectively.

Semiconductor elements 5a to 5f are thus controlled to turn on and off so as to operate as the upper arm and the lower arm of a three-phase inverter. In the manner of use in which U- to W-phase circuits 101 to 103 are individually operated (hereinafter also referred to as "individual use"), the three-phase inverter can be implemented by power semiconductor device 100#. Specifically, semiconductor elements 5a and 5b of U-phase circuit 101 form the upper arm and the lower arm in the U-phase of the three-phase inverter, respectively, semiconductor elements 5c and 5d of V-phase circuit 102 form the upper arm and the lower arm in the V-phase of the three-phase inverter, respectively, and semiconductor elements 5e and 5f of W-phase circuit 103 form the upper arm and the lower arm in the W-phase of the three-phase inverter, respectively.

Figure 3:
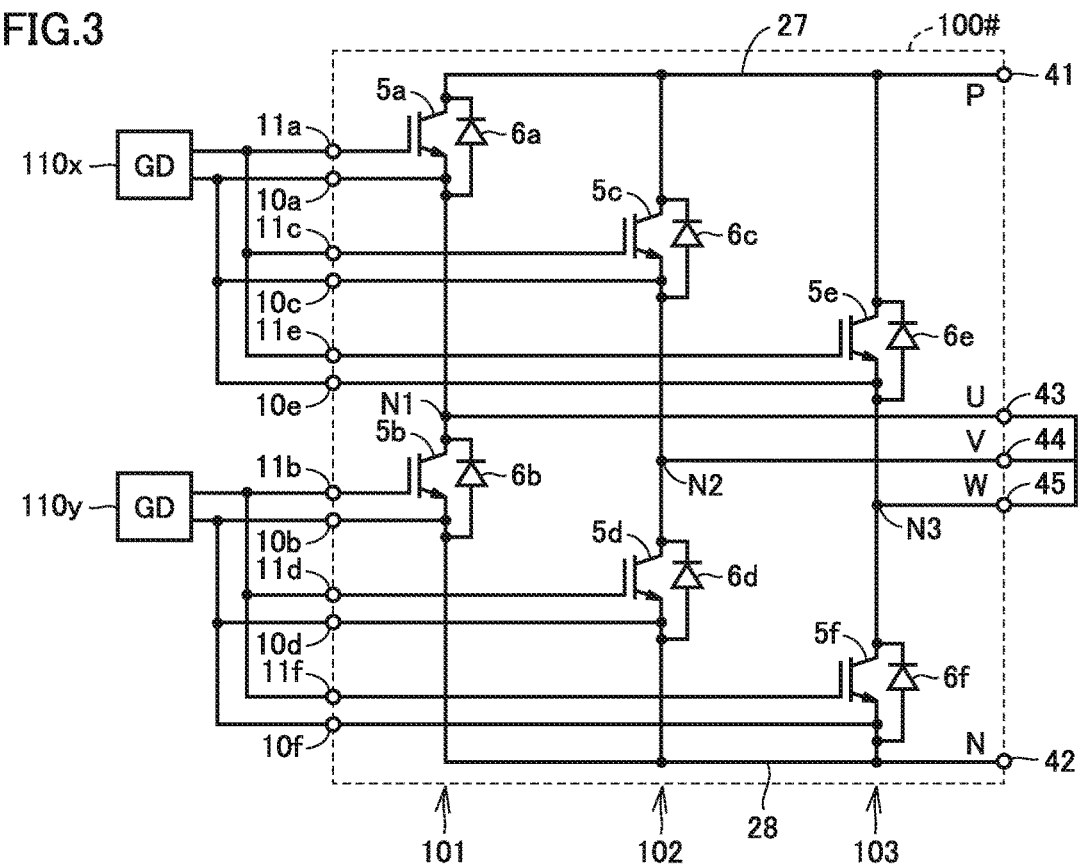
FIG. 3 is a circuit diagram illustrating a state of line connection in a second manner of use (use in parallel connection) of the power semiconductor device shown in FIG. 1.

FIG. 3 shows exemplary arrangement of a drive device in a second manner of use (use in parallel connection) of power semiconductor device 100#.

Referring to FIG. 3, in the second manner of use, output terminals are interconnected and short-circuited among some or all of circuits 101 to 103 in the plurality of phases. In the example in FIG. 3, output terminals 43 to 45 are short-circuited so that U- to W-phase circuits 101 to 103 are connected in parallel and operate in common.

Specifically, semiconductor elements 5a, 5c, and 5e are connected in parallel between high power supply terminal 41 and output nodes N1 to N3 interconnected with output terminals 43 to 45 being interposed. Semiconductor elements 5b, 5d, and 5f are connected in parallel between low power supply terminal 42 and output nodes N1 to N3.

Terminals 10a, 10c, and 10e of respective semiconductor elements 5a, 5c, and 5e in the upper arm are connected in common and connected to a drive device 110x. Similarly, control terminals 11a, 11c, and 11e of respective semiconductor elements 5a, 5c, and 5e are connected in common and connected to drive device 110x. Consequently, gate voltages of semiconductor elements 5a, 5c, and 5e are controlled in common by a voltage pulse signal from drive device 110x. Drive device 110x can control in common turn on and off of semiconductor elements 5a, 5c, and 5e in the upper arm connected in parallel so as to form the upper arm of a half bridge inverter.

Similarly, terminals 10b, 10d, and 10f of respective semiconductor elements 5b, 5d, and 5f in the lower arm are connected in common and connected to a drive device 110y. Similarly, control terminals 11b, 11d, and 11f of respective semiconductor elements 5b, 5d, and 5f are connected in common and connected to drive device 110y. Consequently, gate voltages of semiconductor elements 5b, 5d, and 5f are controlled in common by a voltage pulse signal from drive device 110y. Drive device 110y can control in common turn on and off of semiconductor elements 5b, 5d, and 5f in the lower arm connected in parallel so as to form the lower arm of the half bridge inverter.

Thus, power semiconductor device 100# operating as the three-phase inverter in individual use can also allow use as a circuit in one phase of a half bridge inverter or a multi-phase inverter owing to use in parallel connection achieved by connection of output terminals 43 to 45 and connection to drive device 110. With such flexibility in diversion, convenience of a user can be improved.

In use in parallel connection, however, gate voltages may be imbalanced among the plurality of semiconductor elements connected in parallel due to a stray inductance of a line and a parasitic capacitance of a control electrode. Specifically, imbalance among the gate voltages due to resonance of the gate voltages caused by application of a voltage pulse signal for turning on and off a plurality of semiconductor elements to an LC resonance circuit resulting from the stray inductance and the parasitic capacitance in which LC circuits are connected in parallel is concerned. The configuration of the LC resonance circuit in which imbalanced LC circuits are connected in parallel, due to a difference in length of a line attributed to variation in manufacturing or a layout, is concerned.

When it becomes difficult to control in unison, voltages at control electrodes (gates) of a plurality of semiconductor elements connected in parallel due to a resonance phenomenon in the LC resonance circuit, a current which flows through each semiconductor element becomes non-uniform and disadvantageous occurrence of concentration of heat generation in a specific semiconductor element is concerned.

When such a phenomenon occurs, a current through each of the plurality of semiconductor elements connected in parallel becomes non-uniform due to the difference in gate voltage and disadvantageous occurrence of concentration of heat generation in a specific semiconductor element is concerned. Therefore, in the present embodiment, a configuration of a power semiconductor device allowing use in parallel connection without causing the disadvantage as above will be described.

(Configuration of Power Semiconductor Device According to Embodiment)

Figure 4:
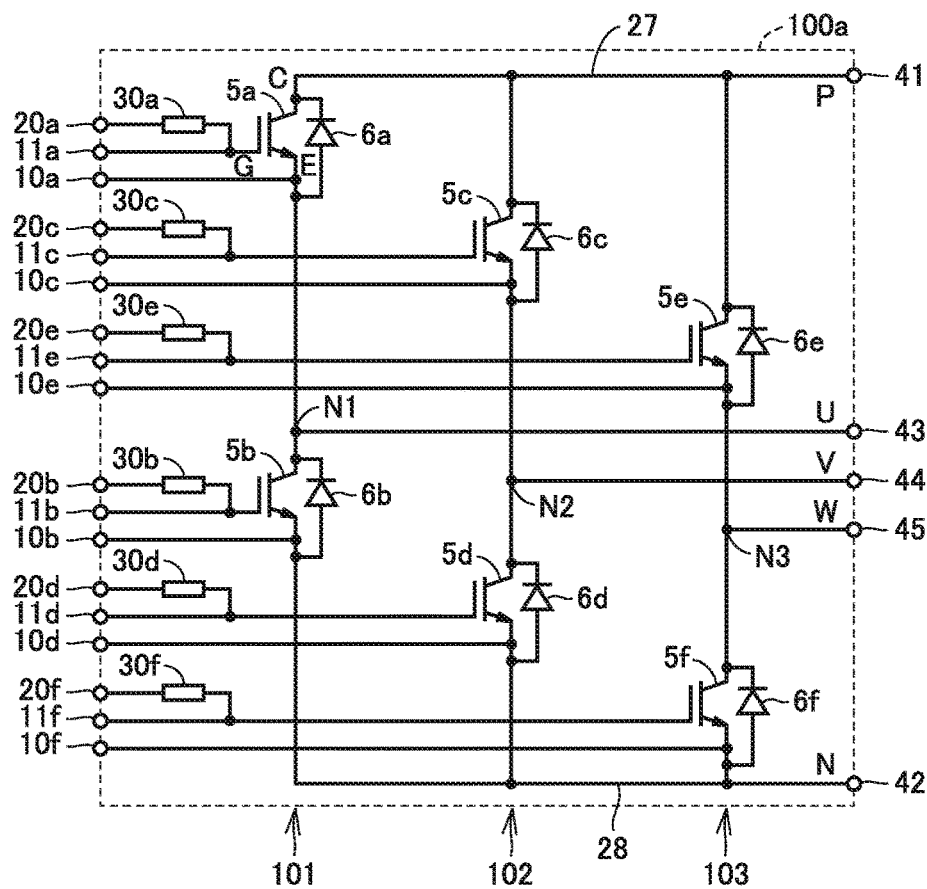
FIG. 4 is a circuit diagram illustrating a configuration of a power semiconductor device according to a first embodiment.

FIG. 4 is a circuit diagram illustrating a configuration of a power semiconductor device according to a first embodiment.

With FIG. 4 being compared with FIG. 1, a power semiconductor device 100a according to the first embodiment is different from power semiconductor device 100# in the comparative example in further including control terminals 20a to 20f and built-in gate resistors 30a to 30f arranged in correspondence with respective semiconductor elements 5a to 5f. Since power semiconductor device 100a is otherwise the same in configuration as power semiconductor device 100# according to the comparative example, detailed description will not be repeated.

Control terminals 20a to 20f can electrically be in contact from the outside of power semiconductor device 100a similarly to control terminals 11a to 11f. Built-in gate resistors 30a to 30f are arranged between control terminals 20a to 20f and the control electrodes (gates) of semiconductor elements 5a to 5f, respectively. Control terminals 20a to 20f are electrically connected to the control electrodes (gates) of semiconductor elements 5a to 5f with built-in gate resistors 30a to 30f being interposed, respectively. Built-in gate resistors 30a to 30f can be implemented by connecting a resistor or increasing a resistance of a material for a line so as to make an electrical resistance value between control terminal 20 and the gate of semiconductor element 5 higher than an electrical resistance value between control terminal 11 and the gate of semiconductor element 5.

In power semiconductor device 100a, U-phase circuit 101, V-phase circuit 102, and W-phase circuit 103 correspond to the "first phase circuit," semiconductor elements 5a, 5c, and 5e in the upper arm correspond to the "first semiconductor element," and semiconductor elements 5b, 5d, and 5f in the lower arm correspond to the "second semiconductor element." Control terminals 20a to 20f correspond to the "first control terminal," control terminals 11a to 11f correspond to the "second control terminal," and built-in gate resistors 30a to 30f correspond to the "first built-in resistor."

Figure 5:
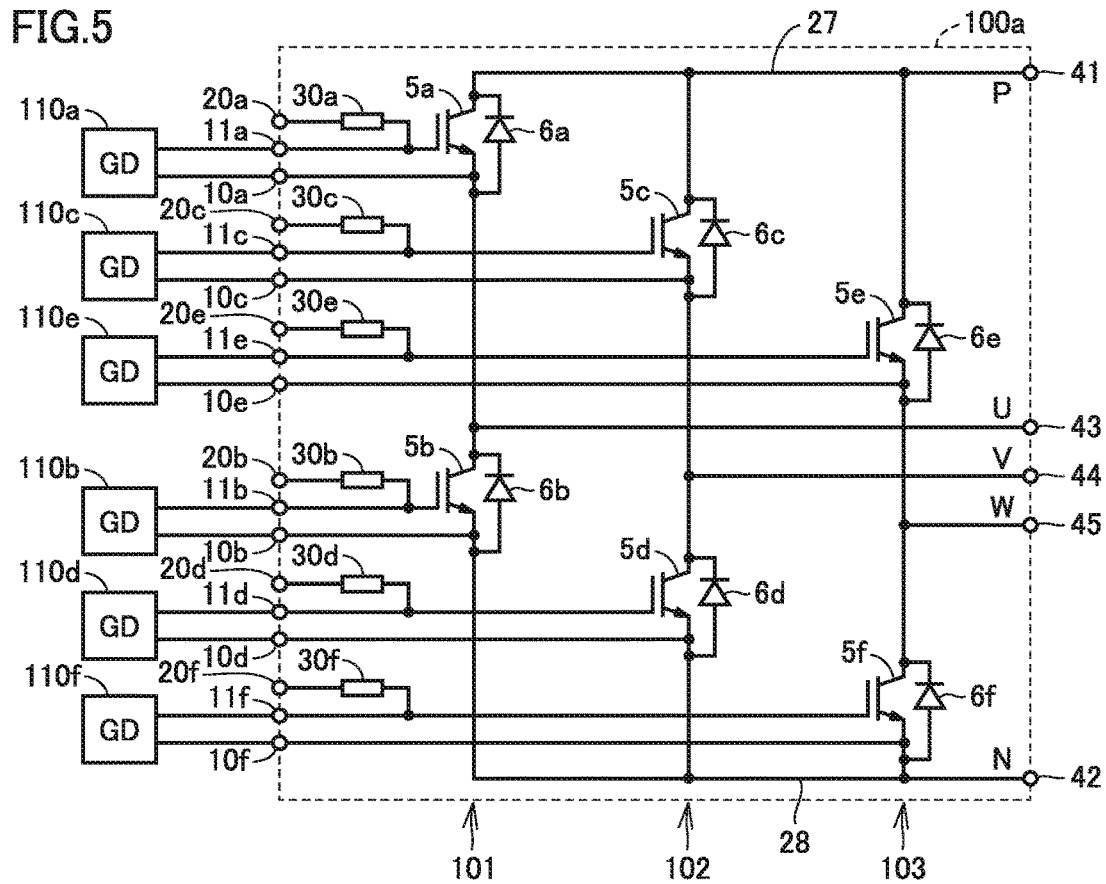
FIG. 5 is a circuit diagram of a drive system configured to adapt to the first manner of use (individual use) of the power semiconductor device according to the first embodiment.

FIG. 5 is a circuit diagram of a drive system configured in the first manner of use (individual use) of power semiconductor device 100a according to the first embodiment.

Referring to FIG. 5, the drive system includes power semiconductor device 100a and drive devices 10a to 110f. In FIG. 5, drive devices 110a to 110f are arranged in order to individually turn on and off semiconductor elements 5a to 5f as in FIG. 2.

Referring to FIG. 5, drive devices 110a to 110f are arranged in correspondence with semiconductor elements 5a to 5f, respectively. Drive devices 110a to 110f input voltage pulse signals for controlling gate voltages of semiconductor elements 5a to 5f to control terminals 11a to 11f of semiconductor elements 5a to 5f, respectively. Since newly provided control terminals 20a to 20f are not connected to drive device 110, built-in gate resistors 30a to 30f are not included in paths for transmission of voltage pulse signals formed between control terminals 11a to 11f and the gates of semiconductor elements 5a to 5f.

Therefore, power semiconductor device 100a according to the first embodiment can control turn on and off of semiconductor elements 5a to 5f similarly to power semiconductor device 100# in the comparative example, with drive devices 110a to 110f in the first manner of use (individual use).

Figure 6:
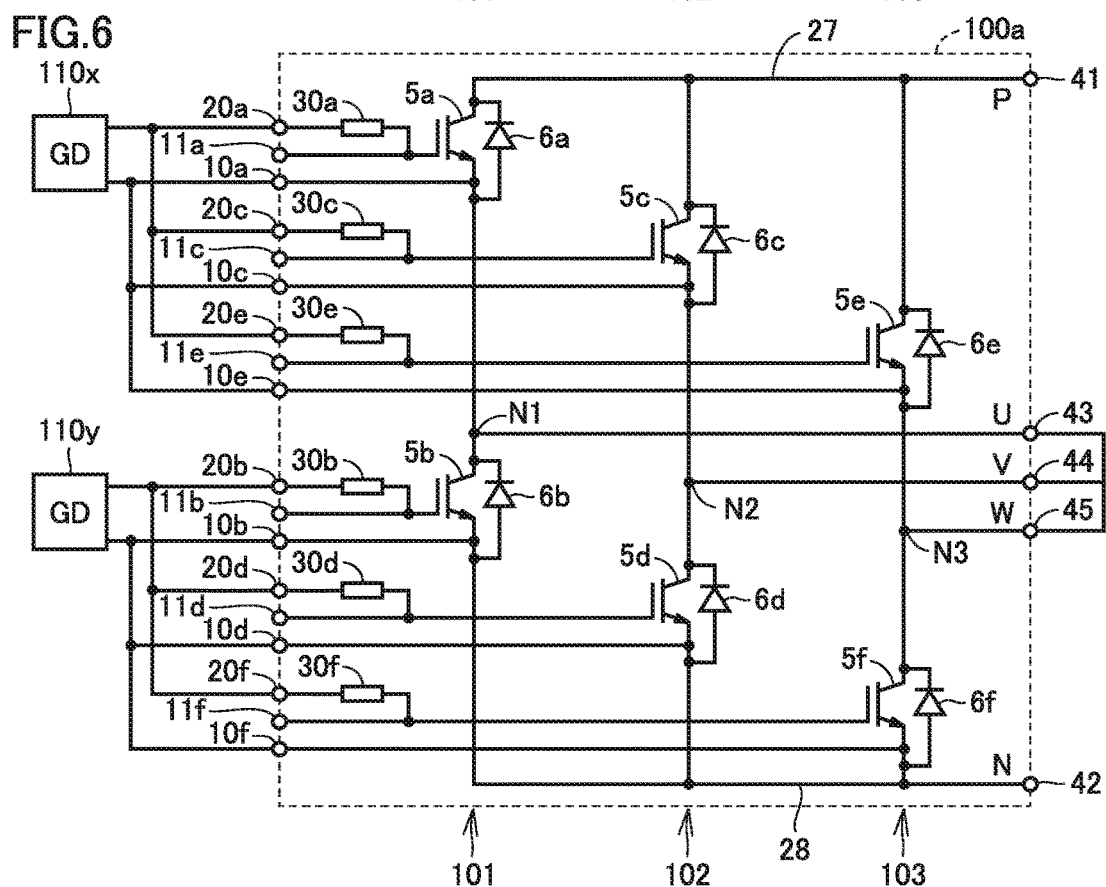
FIG. 6 is a circuit diagram of the drive system configured to adapt to the second manner of use (use in parallel connection) of the power semiconductor device according to the first embodiment.

FIG. 6 is a circuit diagram of a drive system configured in the second manner of use (use in parallel connection) of power semiconductor device 100a according to the first embodiment.

Referring to FIG. 6, the drive system includes power semiconductor device 100a and drive devices 110x and 110y. In FIG. 6, drive device 110x for turning on and off semiconductor elements 5a, 5c, and 5e in the upper arm and drive device 110y for turning on and off the semiconductor elements in the lower arm are arranged as in FIG. 3.

As output terminals 43 to 45 are short-circuited as in FIG. 3, output nodes N1 to N3 are interconnected and U- to W-phase circuits 101 to 103 are connected in parallel. Drive device 110x is connected in common to control terminals 20a, 20c, and 20e of respective semiconductor elements 5a, 5c, and 5e in the upper arm connected in parallel. Similarly, drive device 110y is connected in common to control terminals 20b, 20d, and 20f of respective semiconductor elements 5b, 5d, and 5f in the lower arm connected in parallel.

Thus, semiconductor elements 5a, 5c, and 5e are controlled in common to turn on and off by a voltage pulse signal from drive device 110x, so that they can form an upper arm element of a circuit in one phase of a half bridge inverter or a multi-phase inverter. Semiconductor elements 5b, 5d, and 5f are controlled in common to turn on and off by a voltage pulse signal from drive device 110y as in FIG. 3, so that they can form a lower arm element of a circuit in one phase of a half bridge inverter or a multi-phase inverter.

In use in parallel connection shown in FIG. 6, voltage pulse signals from drive devices 110x and 110y are transmitted from control terminals 20a to 20f to the gates of semiconductor elements 5a to 5f through paths containing built-in gate resistors 30a to 30f in power semiconductor device 100a, respectively. Therefore, built-in gate resistors 30a to 30f can be connected to the LC resonance circuit formed with respect to the gates of the plurality of semiconductor elements connected in parallel described with reference to FIG. 3. Thus, variation in gate voltage can be gentle owing to increase in gate resistance value and sharpness (Q factor) of the LC resonance circuit can be lessened. Consequently, imbalance in current can be suppressed by suppressing imbalance in gate voltage among a plurality of semiconductor elements connected in parallel.

Therefore, according to the configuration of power semiconductor device 100a according to the first embodiment, in individual use, semiconductor elements 5a to 5f are operated as in the comparative example, whereas in use in parallel connection, a current which flows through the plurality of semiconductor elements connected in parallel and controlled in common to turn on and off can be balanced.

In particular, by increasing a gate resistance with built-in gate resistors 30a to 30f, an effect of balancing a current can be enhanced as compared with an example in which a gate resistor is additionally connected to a control terminal with a line from the outside of power semiconductor device 100a. Specifically, tendency of occurrence of imbalance in current due to a resonance phenomenon as a result of lowering in resonance frequency with increase in a stray inductance caused by increase in length of a line by addition of an external line can be avoided. Furthermore, since switching between individual use and use in parallel connection can be made by selecting line connection between control terminals 11 and 20 and drive device 110 without externally connecting a gate resistor, convenience of a user can be enhanced in particular in an application high in restriction on a layout.

Since built-in gate resistors 30a to 30f are not included in paths for voltage pulse signals from drive devices 110a to 110f during individual use in which the possibility of imbalance in current due to the resonance phenomenon is low, switching loss can be suppressed by quickly varying a gate voltage. An optimal value for an electrical resistance value of built-in gate resistors 30a to 30f can be set based on simulation of a circuit or results of tests in actual machines such as a mock-up.

First Modification of First Embodiment

Another example of use in parallel connection of power semiconductor device 100a according to the first embodiment will be described in a first modification of the first embodiment.

Figure 7:
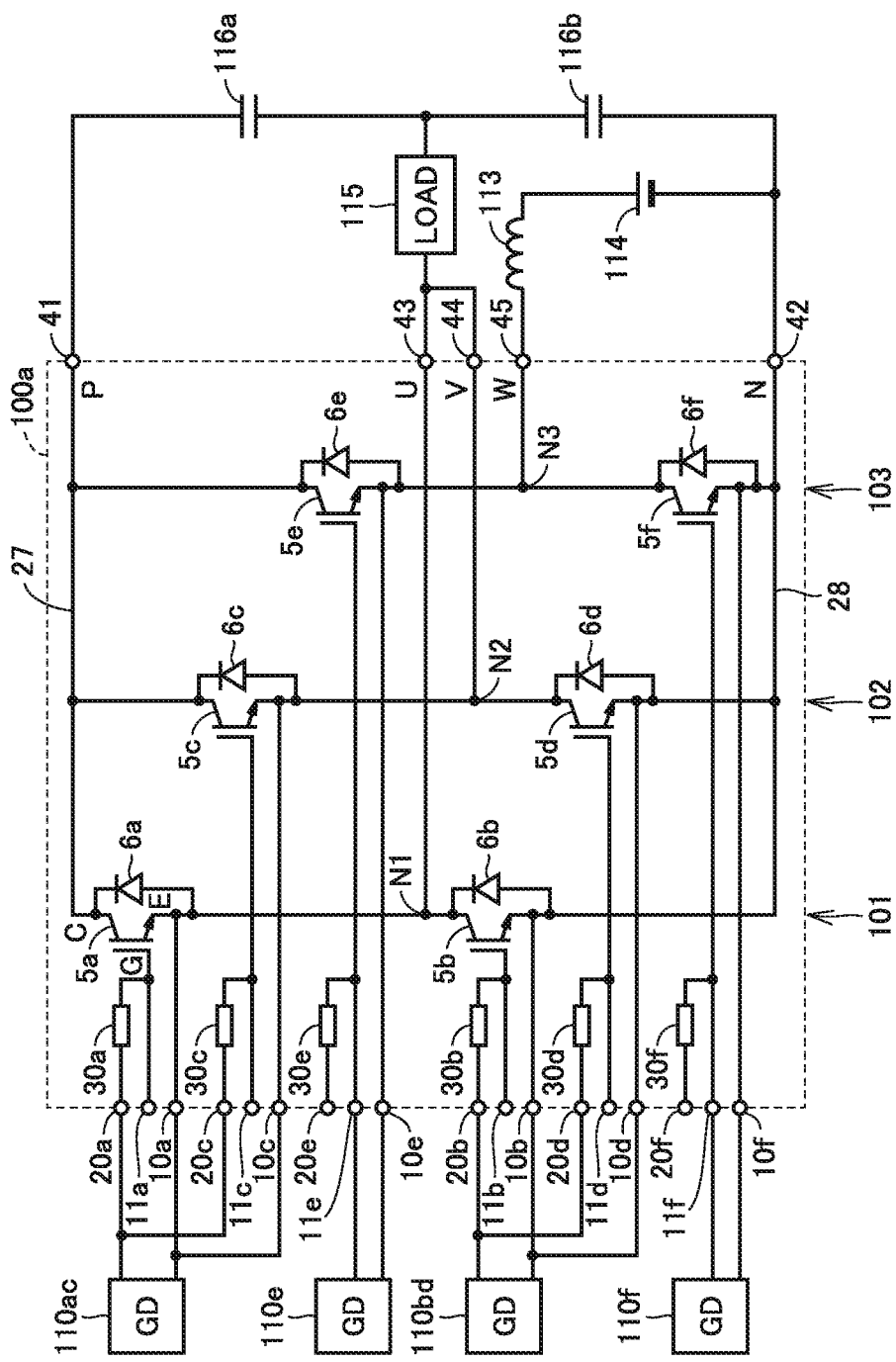
FIG. 7 is a circuit diagram illustrating a manner of use of the power semiconductor device according to a first modification of the first embodiment.

FIG. 7 is a circuit diagram illustrating a manner of use of power semiconductor device 100a shown in FIG. 4, which is different from the first embodiment.

Referring to FIG. 7, though the configuration of power semiconductor device 100a is the same as in the first embodiment, a manner of connection of control terminals 11a to 11f and 20a to 20f and output terminals 43 to 45 is different from that in the first embodiment. In the first modification of the first embodiment, a boost chopper and a half bridge inverter can be implemented by use in parallel connection of some of semiconductor elements 5a to 5f of power semiconductor device 100a.

In FIG. 7, output terminals 43 and 44 are short-circuited and connected to a load 115. Thus, in the upper arm, semiconductor elements 5a and 5c are connected in parallel, and in the lower arm, semiconductor elements 5b and 5d are connected in parallel.

In U-phase circuit 101 and V-phase circuit 102, control terminals 20a and 20c of respective semiconductor elements 5a and 5c in the upper arm connected in parallel are connected in common to a drive device 110ac. Similarly, control terminals 20b and 20d of respective semiconductor elements 5b and 5d in the lower arm connected in parallel are connected in common to a drive device 110d. Semiconductor elements 5a and 5c and semiconductor elements 5b and 5d are used as being connected in parallel.

Control terminal 11e of semiconductor element 5e and control terminal 11f of semiconductor element 5f are connected to separate drive device 110e and drive device 110f, respectively. Semiconductor elements 5e and 5f of W-phase circuit 103 are used individually, without being connected in parallel to another semiconductor element 5.

On the outside of power semiconductor device 100a, high power supply terminal 41 is connected to load 115 with a capacitor 116a being interposed. Low power supply terminal 42 is connected to load 115 with a capacitor 116b being interposed. A reactor 113 and a direct-current (DC) power supply 114 are connected in series between output terminal 45 of W-phase circuit 103 and low power supply terminal 42.

Therefore, semiconductor elements 5e (upper arm) and 5f (lower arm) of W-phase circuit 103 and reactor 113 and DC power supply 114 can implement a boost chopper which outputs a DC voltage Vo across low power supply terminal 42 and high power supply terminal 41. An output voltage from the boost chopper can be controlled to be higher than an output voltage from DC power supply 114.

Semiconductor elements 5a and 5c in the upper arm connected in parallel and semiconductor elements 5b and 5d in the lower arm can implement a half bridge inverter which converts DC voltage Vo into an alternating current (AC) voltage and supplies the AC voltage to load 115.

As in the modification of the first embodiment, only some of the plurality of semiconductor elements contained in power semiconductor device 100a can be used as being connected in parallel. Switching of semiconductor elements connected in parallel and each individually used semiconductor element can be made by selecting line connection between control terminals 11 and 20 and drive device 110 as in the first embodiment. As in the first embodiment, in the semiconductor elements connected in parallel, non-uniformity in current can be suppressed by built-in gate resistor 30 and switching loss can be suppressed without a gate resistance being excessive in each individually used semiconductor element.

Second Modification of First Embodiment

Figure 8:
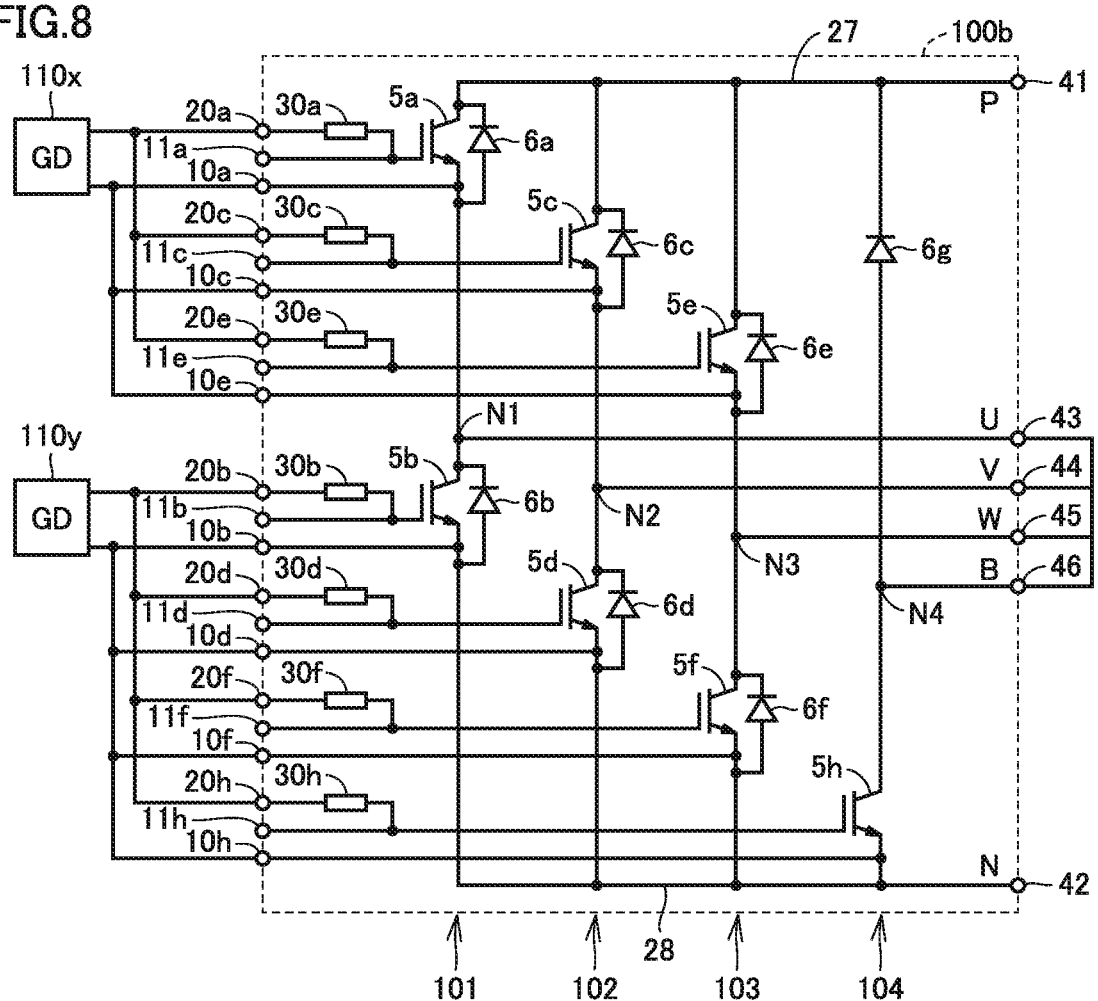
FIG. 8 is a circuit diagram illustrating a configuration of a power semiconductor device according to a second modification of the first embodiment.

FIG. 8 is a circuit diagram illustrating a configuration of a power semiconductor device according to a second modification of the first embodiment.

Referring to FIG. 8, a power semiconductor device 100b according to the second modification of the first embodiment is different from power semiconductor device 100a according to the first embodiment in further including a B-phase circuit 104 and an output terminal 46. Since power semiconductor device 100b is otherwise the same in configuration as power semiconductor device 100a, detailed description will not be repeated.

B-phase circuit 104 has a semiconductor element 5h and a rectifying element 6g connected in series with an output node N4 being interposed, between power supply lines 27 and 28. In semiconductor element 5h, a terminal 10h and control terminals 11h and 20h as well as a built-in gate resistor 30h are arranged similarly to terminals 10a to 10f and control terminals 11a to 11f and 20a to 20f as well as built-in gate resistors 30a to 30f of respective semiconductor elements 5a to 5f. B-phase circuit 104 corresponds to the "second phase circuit" and semiconductor element 5h corresponds to the "third semiconductor element."

Though FIG. 8 further shows a configuration of a drive system in use in parallel connection of power semiconductor device 100b, individual use of semiconductor elements 5a to 5h in power semiconductor device 100b will initially be described.

Figure 19:
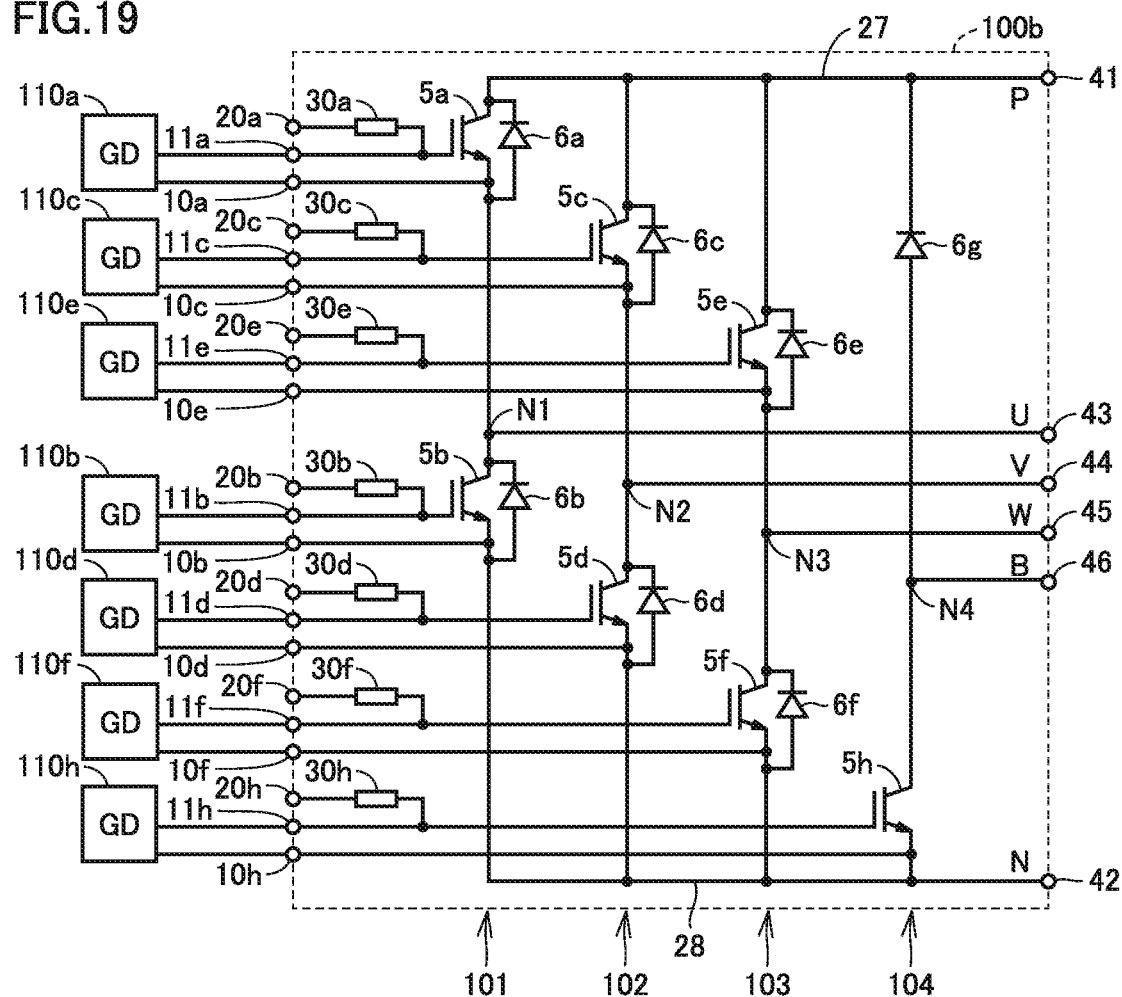
FIG. 19 is a circuit diagram of a drive system configured in individual use of the power semiconductor device according to the second modification of the first embodiment.

When semiconductor elements 5a to 5f and 5h of power semiconductor device 100b are used individually, as shown in FIG. 19, semiconductor elements 5a to 5f and 5h have control terminals 11a to 11f and 11h connected to individual drive devices 110a to 110f and 110h, respectively. Thus, semiconductor elements 5a to 5f and 5h can individually be turned on and off in accordance with individual voltage pulse signals input to control terminals 11a to 11f and 11h, respectively. Output terminals 43 to 46 are individually connected to an external element of power semiconductor device 100b.

Thus, U- to W-phase circuits 101 to 103 implemented by semiconductor elements 5a to 5f can implement a three-phase inverter as in FIG. 5. Furthermore, in B-phase circuit 104, with a combination of the rectifying element in the upper arm and the semiconductor element controlled to turn on and off in the lower arm with a not-shown brake resistor connected between high power supply terminal 41 and output terminal 46, a brake chopper which absorbs regenerative power can be implemented.

In contrast, in use in parallel connection of power semiconductor device 100b, as shown in FIG. 8, output terminals 43 to 46 are short-circuited and hence semiconductor elements 5a, 5c, and 5e in the upper arm are connected in parallel with interconnected output nodes N1 to N4 being interposed. Semiconductor elements 5a, 5c, and 5e connected in parallel are controlled in common to turn on and off by drive device 110x. In semiconductor elements 5a, 5c, and 5e, a voltage pulse signal from drive device 110x is input to control terminals 20a, 20c, and 20e connected to respective built-in gate resistors 30a, 30c, and 30e.

Similarly, semiconductor elements 5b, 5d, 5f, and 5h in the lower arm connected in parallel with interconnected output nodes N1 to N4 being interposed are controlled in common to turn on and off by drive device 110y. In semiconductor elements 5b, 5d, 5f, and 5h, a voltage pulse signal from drive device 110y is input to control terminals 20b, 20d, 20f, and 20h connected to respective built-in gate resistors 30b, 30d, 30f, and 30h.

Thus, in power semiconductor device 100b according to the second modification of the first embodiment as well, an upper arm element and a lower arm element of a circuit in one phase of a half bridge inverter or a multi-phase inverter can be formed owing to use in parallel connection. In power semiconductor device 100b, the lower arm is greater in number of semiconductor elements connected in parallel than the upper arm. Consequently, a circuit in one phase in which the lower arm is higher in capacity of a current than the upper arm can be implemented by one power semiconductor device (module).

Since electrical resistance values of built-in gate resistors 30b, 30d, 30f, and 30h are preferably set to optimal values at the time when four semiconductor elements are used as being connected in parallel, they can be set to electrical resistance values different from those for built-in gate resistors 30a, 30c, and 30e.

In contrast to the example in FIG. 8, B-phase circuit 104 of power semiconductor device 100b can also be configured such that a semiconductor element which can be controlled to turn on and off is arranged in the upper arm and a rectifying element is arranged in the lower arm. Thus, according to the power semiconductor device according to the second modification of the first embodiment, a circuit in one phase different in capacity of a current between the upper arm and the lower arm can readily be configured by use in parallel connection of a single power semiconductor device alone.

Third Modification of First Embodiment

Figure 9:
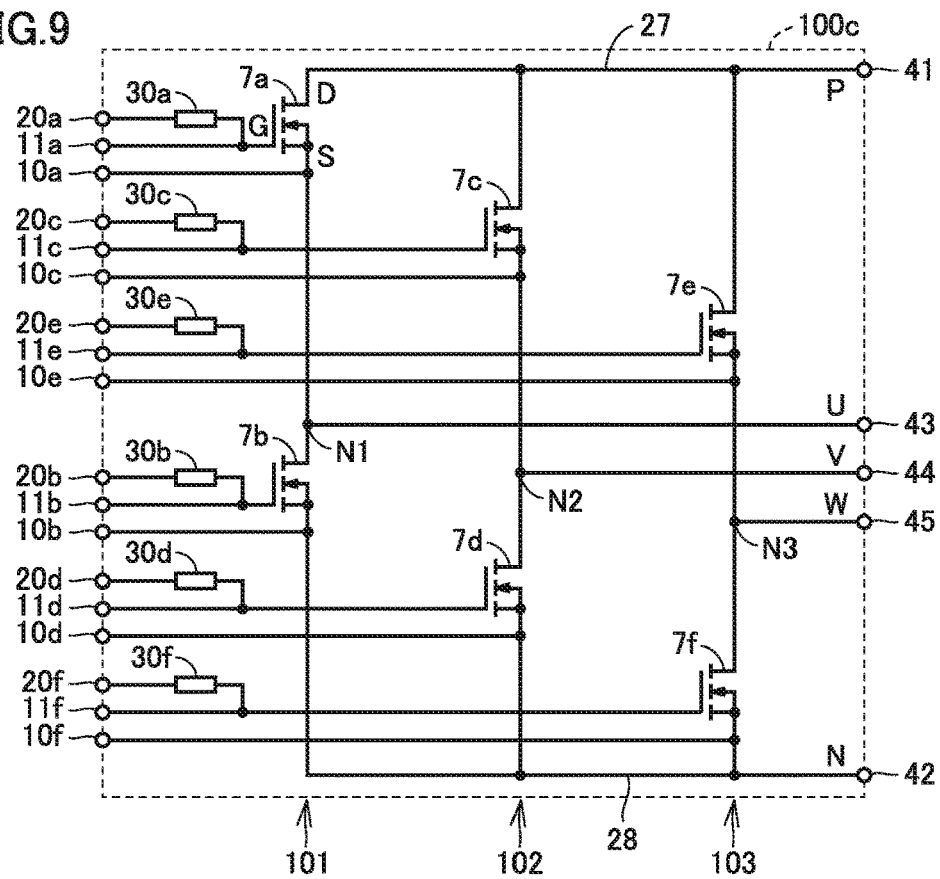
FIG. 9 is a circuit diagram illustrating a configuration of a power semiconductor device according to a third modification of the first embodiment.

FIG. 9 is a circuit diagram illustrating a configuration of a power semiconductor device according to a third modification of the first embodiment.

Referring to FIG. 9, a power semiconductor device 100c according to the third modification of the first embodiment is different from power semiconductor device 100a according to the first embodiment in including semiconductor elements 7a to 7f implemented by a metal oxide semiconductor field effect transistor (MOSFET) instead of semiconductor elements 5a to 5f and freewheeling diodes 6a to 6f. Since the freewheeling diode can be implemented by a parasitic diode in the MOSFET, a diode connected in anti-parallel does not have to be arranged in semiconductor elements 7a to 7f. Thus, the number of internal lines can be reduced, which contributes to reduction in size of a power semiconductor device.

Each of semiconductor elements 7a to 7f implemented by the MOSFET has a drain (D) and a source (S) representing main electrodes rendered conducting or non-conducting in accordance with a voltage at the gate (G) (gate voltage) with respect to the source (S). Semiconductor elements 7a to 7f are also provided with terminals 10a to 10f, control terminals 11a to 11f and 20a to 20f, and built-in gate resistors 30a to 30f similarly to semiconductor elements 5a to 5f in FIG. 4, respectively.

Therefore, in power semiconductor device 100c as well, switching between use in parallel connection and individual use as in power semiconductor device 100a can be made by selecting line connection between control terminals 11 and 20 and drive device 110.

In the first and second modifications of the first embodiment as well, semiconductor elements 5a to 5f and freewheeling diodes 6a to 6f can be replaced with semiconductor elements 7a to 7f (MOSFETs). Alternatively, semiconductor elements 5a to 5f and freewheeling diodes 6a to 6f can also be replaced with monolithic reverse conducting IGBTs.

Second Embodiment

Variations of a connection configuration between a control electrode (gate) of a semiconductor element and a drive device will be described in subsequent embodiments.

Figure 10:
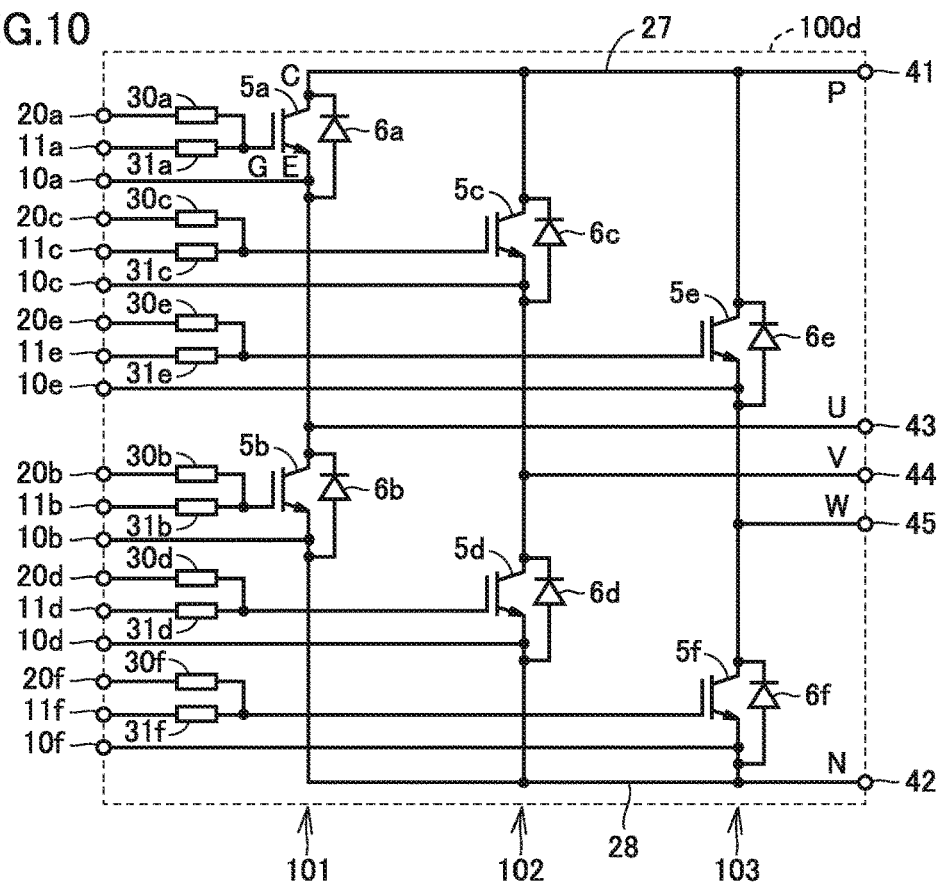
FIG. 10 is a circuit diagram illustrating a configuration of a power semiconductor device according to a second embodiment.

FIG. 10 is a circuit diagram illustrating a configuration of a power semiconductor device according to a second embodiment.

With FIG. 10 being compared with FIG. 4, a power semiconductor device 100d according to the second embodiment is different from power semiconductor device 100a according to the first embodiment in further including built-in gate resistors 31a to 31f. Since power semiconductor device 100d is otherwise the same in configuration as power semiconductor device 100a, detailed description will not be repeated. Built-in gate resistors 31a to 31f correspond to the "second built-in resistor."

For power semiconductor device 100d according to the second embodiment, in individual use, a drive system which individually turns on and off semiconductor elements 5a to 5f can be implemented by connecting individual drive devices 110a to 110f to control terminals 11a to 11f of semiconductor elements 5a to 5f, respectively, as in FIG. 5. In use in parallel connection, a drive system turning on and off in common a plurality of semiconductor elements connected in parallel can be implemented by short-circuiting output terminals 43 to 45, connecting drive device 110x to control terminals 20a, 20c, and 20e of respective semiconductor elements 5a, 5c, and 5e in the upper arm, and connecting drive device 110x to control terminals 20b, 20d, and 20f of respective semiconductor elements 5b, 5d, and 5f in the lower arm as in FIG. 6.

Built-in gate resistors 31a to 31f are electrically connected between control terminals 11a to 11f used in individual use and the control electrodes (gates) of semiconductor elements 5a to 5f, respectively. Control terminal 11 and built-in gate resistor 31 which are used in individual use and control terminal 20 and built-in gate resistor 30 which are used in use in parallel connection are connected in parallel with respect to the gate of each semiconductor element 5.

Built-in gate resistors 31a to 31f can also be implemented by connecting a resistor or increasing a resistance of a material for a line. Built-in gate resistors 31a to 31 fare configured to be lower in electrical resistance value than built-in gate resistors 30a to 30f in use in parallel connection. Electrical resistance values of built-in gate resistors 31a to 31f can be set by designing an optimal value for a gate resistance in turning on and off semiconductor elements 5a to 5f alone based on simulation of a circuit or results of tests in actual machines such as a mock-up.

According to power semiconductor device 100d according to the second embodiment, in addition to the effect in the first embodiment, switching loss in individual use can be suppressed and imbalance in current among semiconductor elements in use in parallel connection can be suppressed without connecting a resistive element from the outside of the power semiconductor device in each of individual use and use in parallel connection.

Figure 20:
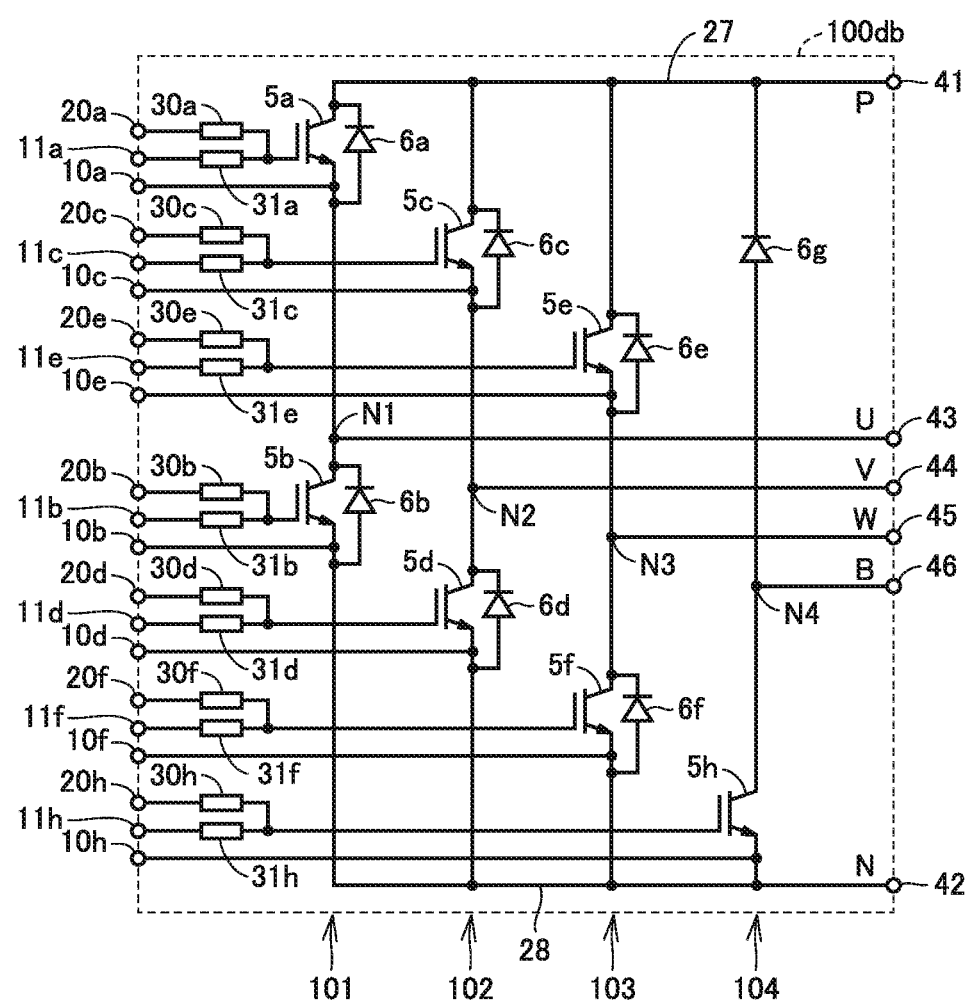
FIG. 20 is a circuit diagram illustrating a configuration of a power semiconductor device according to a combination of the second modification of the first embodiment and the second embodiment.

The second embodiment can also be combined with the configuration in the first and second modifications of the first embodiment by further connecting built-in gate resistors 31a to 31f as in FIG. 10. For example, as in a power semiconductor device 100db shown in FIG. 20, built-in gate resistors 30h and 31h and control terminals 11h and 20h can be provided similarly to FIG. 10 for the control electrode (gate) of semiconductor element 5h of power semiconductor device 100b shown in FIG. 8.

Third Embodiment

Figure 11:
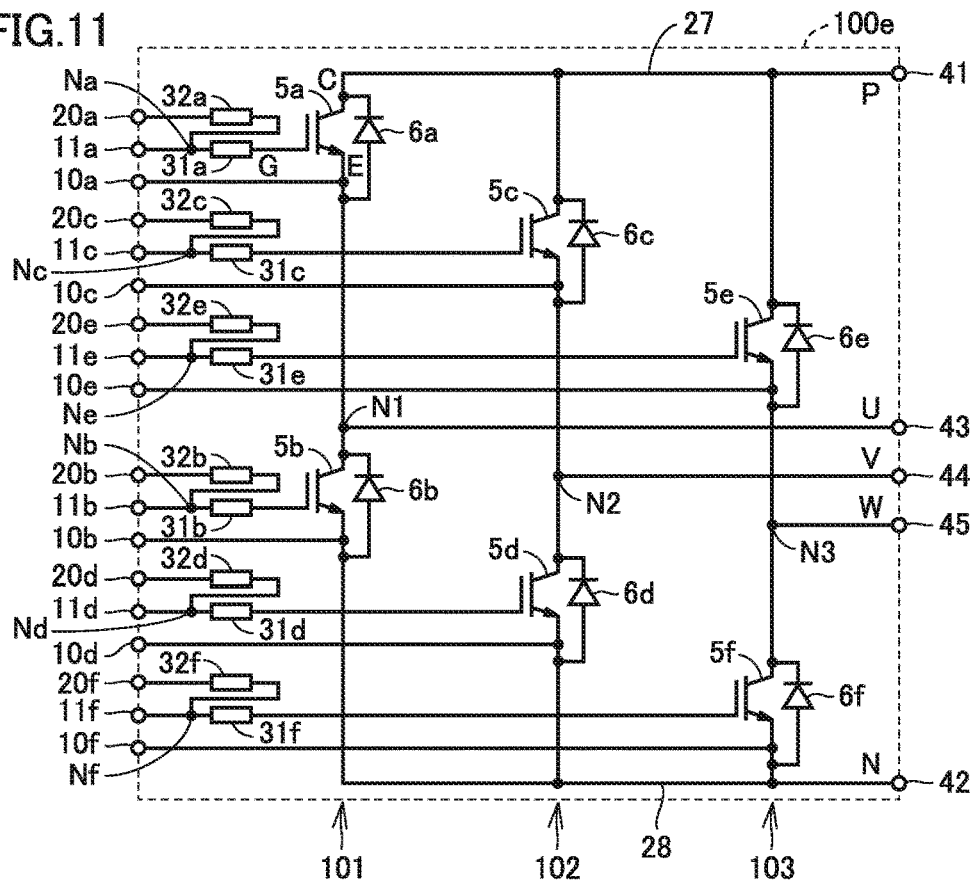
FIG. 11 is a circuit diagram illustrating a configuration of a power semiconductor device according to a third embodiment.

FIG. 11 is a circuit diagram illustrating a configuration of a power semiconductor device according to a third embodiment.

With FIG. 11 being compared with FIG. 4, a power semiconductor device 100e according to the third embodiment is different from power semiconductor device 100a according to the first embodiment in that built-in gate resistors 31a to 3 f are further provided and built-in gate resistors 32a to 32f are arranged instead of built-in gate resistors 30a to 30f. Built-in gate resistors 31a to 31f are electrically connected between control terminals 11a to 11f used in individual use and the control electrodes (gates) of semiconductor elements 5a to 5f, respectively, as in the second embodiment. Built-in gate resistors 32a to 32f are connected between control terminals 20a to 20f and nodes Na to Nf between control terminals 11a to 11f and built-in gate resistors 31a to 31f, respectively. Since power semiconductor device 100e is otherwise the same in configuration as power semiconductor device 100a, detailed description will not be repeated.

In power semiconductor device 100e, control terminals 20a to 20f correspond to the "first control terminal," control terminals 11a to 11f correspond to the "second control terminal," built-in gate resistors 32a to 32f correspond to the "first built-in resistor," and built-in gate resistors 31a to 31f correspond to the "second built-in resistor."

In power semiconductor device 100e according to the third embodiment as well, in individual use, individual drive devices 110a to 110f can be connected to control terminals 11a to 11f of semiconductor elements 5a to 5f, respectively, as in FIG. 5. In use in parallel connection, output terminals 43 to 45 are short-circuited, drive device 110x can be connected to control terminals 20a, 20c, and 20e of respective semiconductor elements 5a, 5c, and 5e in the upper arm, and drive device 110y can be connected to control terminals 20b, 20d, and 20f of respective semiconductor elements 5b, 5d, and 5f in the lower arm as in FIG. 6.

In power semiconductor device 100e, control terminals 11a to 11f used in individual use are connected to the control electrodes (gates) of semiconductor elements 5a to 5f with built-in gate resistors 31a to 31f being interposed, respectively, as in the second embodiment. Therefore, built-in gate resistors 31a to 31f are configured to have electrical resistance values which are to attain to an optimal value for a gate resistance in turning on and off semiconductor elements 5a to 5f alone.

Control terminals 20a to 20f used in use in parallel connection are connected to the control electrodes (gates) of semiconductor elements 5a to 5f with built-in gate resistors 32a to 32f and 31a to 31f connected in series being interposed, respectively. Therefore, an electrical resistance value of built-in gate resistor 32 can be set such that built-in gate resistors 31 and 32 are equivalent in electrical resistance value to built-in gate resistor 30 in the first embodiment.

Thus, in power semiconductor device 100e according to the third embodiment, a drive system realizing individual use as in the second embodiment by inputting voltage pulse signals for individually turning on and off semiconductor elements 5a to 5f to control terminals 11a to 11f, respectively, by line connection as in FIG. 5 can be implemented. Furthermore, in use in parallel connection, a drive system which controls turn on and off in common of a plurality of semiconductor elements connected in parallel by line connection as in FIG. 6, with a gate resistance being adjusted so as not to cause imbalance in current due to resonance of a gate voltage, can be implemented.

Built-in gate resistors 32a to 32f can be lower in electrical resistance value and power consumption than built-in gate resistors 30a to 30f in FIG. 4 (the first embodiment) and FIG. 10 (the second embodiment). Therefore, built-in gate resistors 32a to 32f can be smaller in size than built-in gate resistors 30a to 30f.

Consequently, the configuration in which a built-in resistor is arranged for optimizing a gate resistance in both of individual use and use in parallel connection as in the second embodiment can be smaller in size than in the second embodiment.

Figure 21:
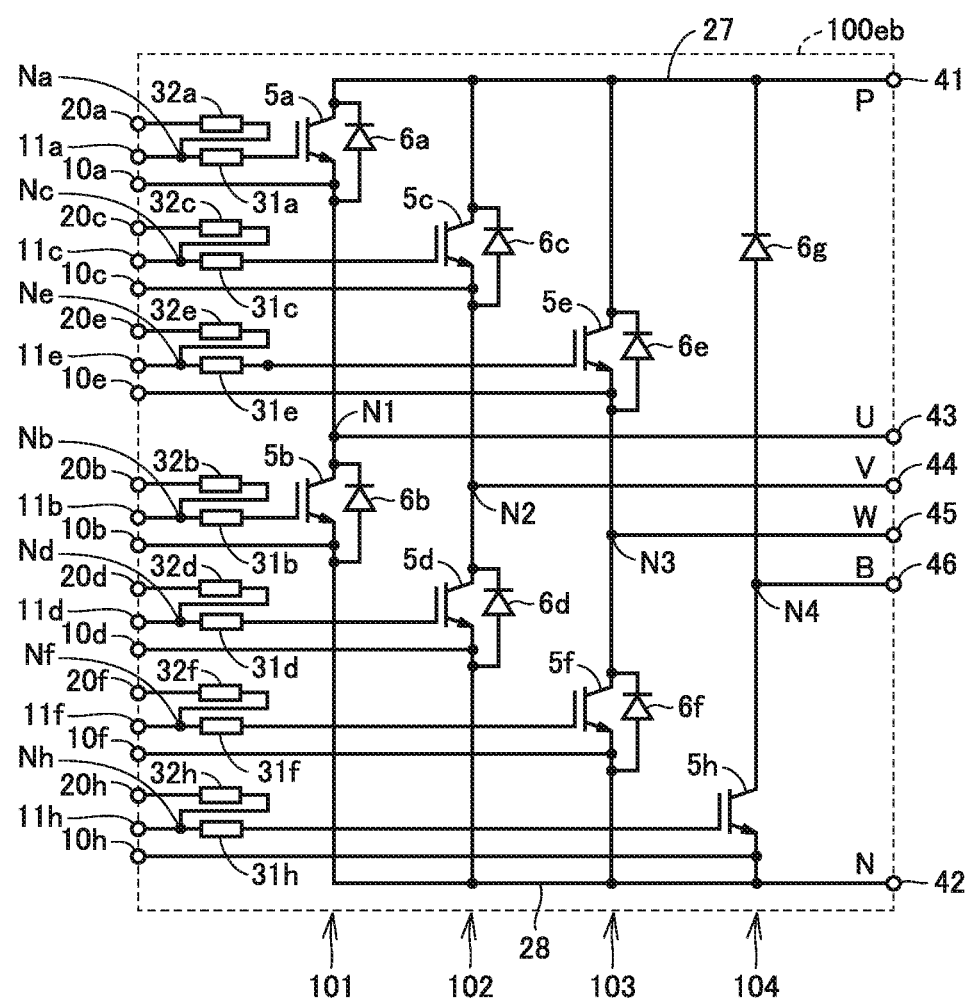
FIG. 21 is a circuit diagram illustrating a configuration of a power semiconductor device according to a combination of the second modification of the first embodiment and the third embodiment.

The third embodiment can also be combined with the configuration in the first and second modifications of the first embodiment by similarly connecting built-in gate resistors 31a to 31f and 32a to 32f as in FIG. 11. For example, as in a power semiconductor device 100eb shown in FIG. 21, built-in gate resistors 31h and 32h and control terminals 11h and 20h can be provided similarly to FIG. 11 for the control electrode (gate) of semiconductor element 5h of power semiconductor device 100b shown in FIG. 8.

Fourth Embodiment

Figure 12:
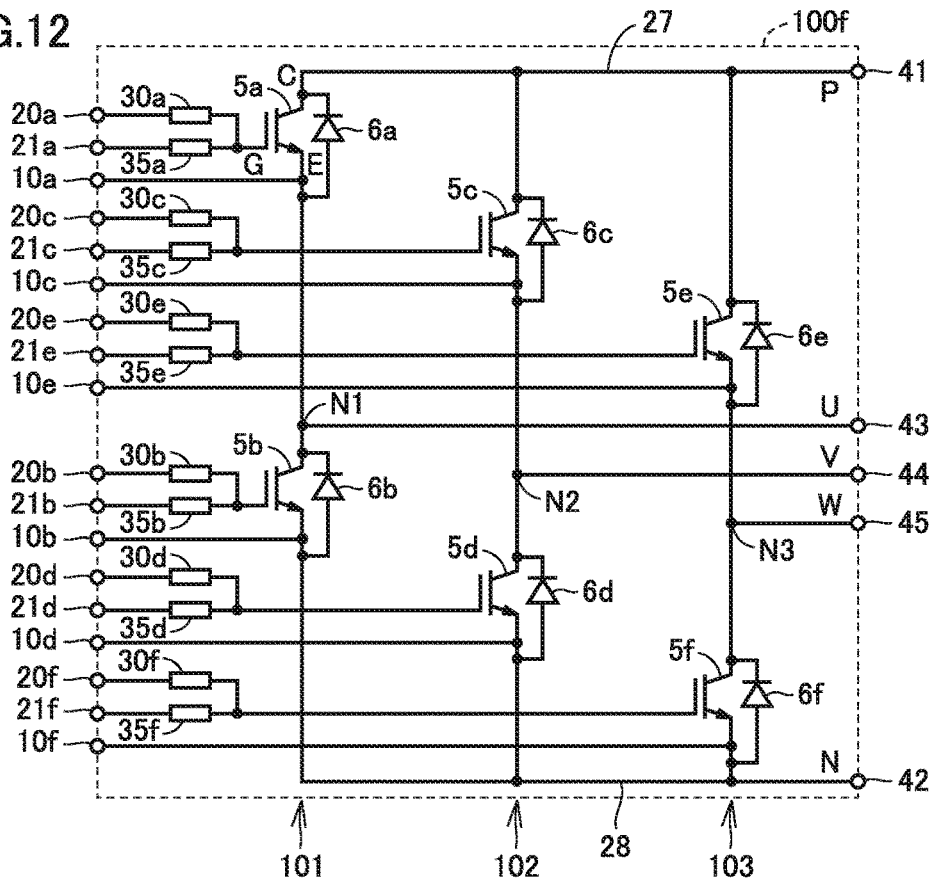
FIG. 12 is a circuit diagram illustrating a configuration of a power semiconductor device according to a fourth embodiment.

FIG. 12 is a circuit diagram illustrating a configuration of a power semiconductor device according to a fourth embodiment.

With FIG. 12 being compared with FIG. 4, a power semiconductor device 100f according to the fourth embodiment is different from power semiconductor device 100a according to the first embodiment in including control terminals 21a to 21f and built-in gate resistors 35a to 35f instead of control terminals 11a to 11f used in individual use.

Built-in gate resistors 35a to 35f are connected between control terminals 21a to 21f and the control electrodes (gates) of semiconductor elements 5a to 5f, respectively. Therefore, control terminal 20 and built-in gate resistor 30 and control terminal 21 and built-in gate resistor 35 are connected in parallel with respect to the gate of each semiconductor element 5. Since power semiconductor device 100f is otherwise the same in configuration as power semiconductor device 100a, detailed description will not be repeated.

In power semiconductor device 100f, control terminals 20a to 20f correspond to the "first control terminal," control terminals 21a to 21f correspond to the "second control terminal," built-in gate resistors 30a to 30f correspond to the "first built-in resistor," and built-in gate resistors 35a to 35f correspond to the "second built-in resistor." Built-in gate resistors 35a to 35f can also be implemented by connecting a resistor or making a resistance of a material for a line higher.

Figure 13:
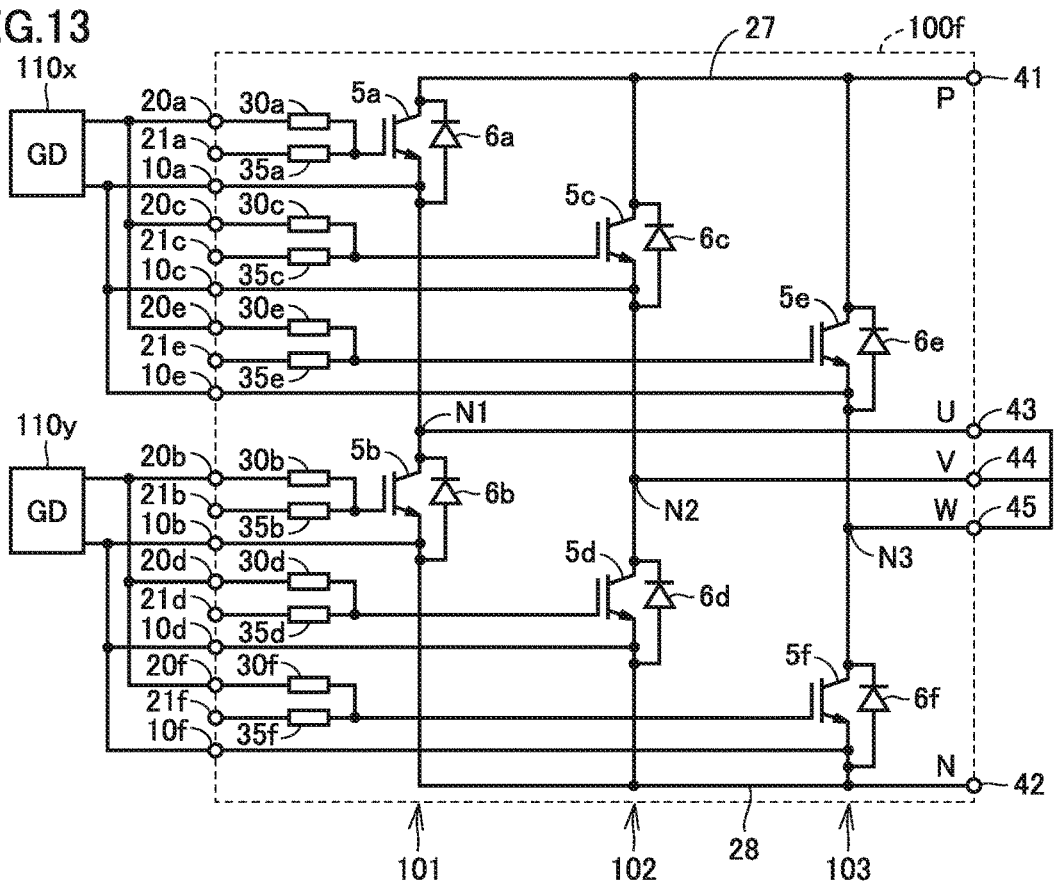
FIG. 13 is a circuit diagram of a drive system configured in use in parallel connection of the power semiconductor device according to the fourth embodiment.

FIG. 13 shows a circuit diagram of a drive system implemented in use in parallel connection of power semiconductor device 100f according to the fourth embodiment.

Referring to FIG. 13, in the drive system in use in parallel connection, in semiconductor elements 5a, 5c, and 5e in the upper arm, terminals 10a, 10c, and 10e and control terminals 20a, 20c, and 20e are connected to drive device 110x as in FIG. 6. Similarly, in semiconductor elements 5b, 5d, and 5f in the lower arm, terminals 10b, 10d, and 10f and control terminals 20b, 20d, and 20f are connected to drive device 110y.

Therefore, in use in parallel connection, built-in gate resistor 30 having an electrical resistance value the same as in the first embodiment sets a gate resistance for suppressing occurrence of imbalance in current among a plurality of semiconductor elements connected in parallel.

Figure 14:
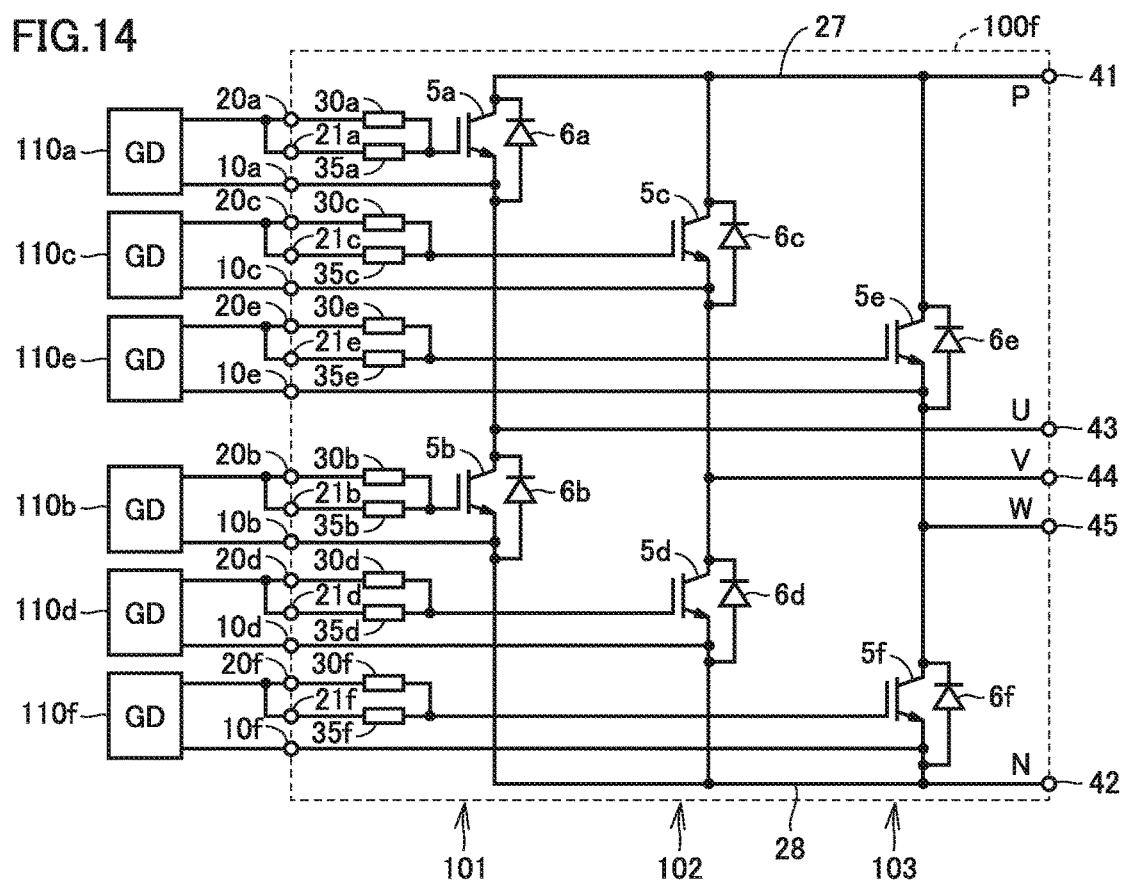
FIG. 14 is a circuit diagram of a drive system configured in individual use of the power semiconductor device according to the fourth embodiment.

FIG. 14 shows a circuit diagram of a drive system implemented in individual use of power semiconductor device 100f according to the fourth embodiment.

Referring to FIG. 14, in the drive system in individual use, each semiconductor element 5 has control terminals 20 and 21 short-circuited owing to line connection outside power semiconductor device 100f. Semiconductor elements 5a to 5f have terminals 10a to 10f and short-circuited control terminals 21a to 21f and 20a to 20f connected to drive devices 110a to 1110f as in FIG. 5, respectively.

Therefore, gate resistors of respective semiconductor elements 5a to 5f in individual use are implemented by parallel connection of built-in gate resistors 30 and 35. Therefore, an electrical resistance value of built-in gate resistor 35 can be set such that an electrical resistance value resulting from parallel connection attains to an electrical resistance value of built-in gate resistor 31 in the second embodiment, that is, an optimal value for a gate resistance in individual use.

An electrical resistance value of built-in gate resistor 30 is determined in correspondence with an optimal value in use in parallel connection and higher than an electrical resistance value to be achieved by parallel connection (an electrical resistance value of built-in gate resistor 31). Therefore, an optimal value for the gate resistance in individual use can be achieved with an electrical resistance value of built-in gate resistor 35 being defined as a variable.

Thus, in power semiconductor device 100f according to the fourth embodiment, a gate resistance can be set in both of use in parallel connection and individual use shown in FIGS. 13 and 14 as in the second embodiment.

Built-in gate resistors 35a to 35f can be lower in power consumption than built-in gate resistors 31a to 31f in FIG. 10 (the second embodiment) and FIG. 11 (the third embodiment). Therefore, built-in gate resistors 35a to 35f can be smaller in size than built-in gate resistors 31a to 31f Consequently, the configuration in which a built-in resistor is arranged in order to optimize a gate resistance in both of individual use and use in parallel connection can be smaller in size than in the second embodiment.

Figure 22:
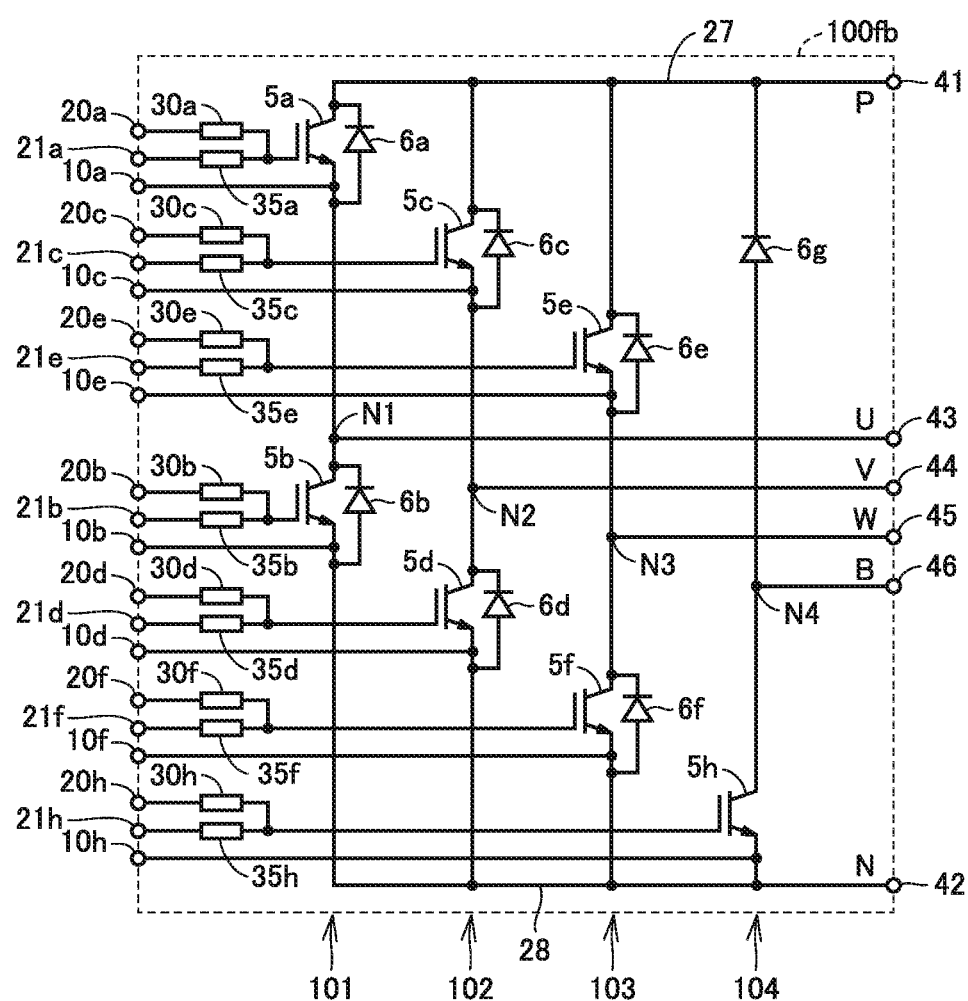
FIG. 22 is a circuit diagram illustrating a configuration of a power semiconductor device according to a combination of the second modification of the first embodiment and the fourth embodiment.

The fourth embodiment can also be combined with the configuration in the first and second modifications of the first embodiment by similarly connecting control terminals 20a to 20f and built-in gate resistors 35a to 35f as in FIG. 12. For example, as in a power semiconductor device 100fb shown in FIG. 22, built-in gate resistors 30h and 35h and control terminals 20h and 21h can be provided similarly to FIG. 12 for the control electrode (gate) of semiconductor element 5h of power semiconductor device 100b shown in FIG. 8.

Fifth Embodiment

Figure 15:
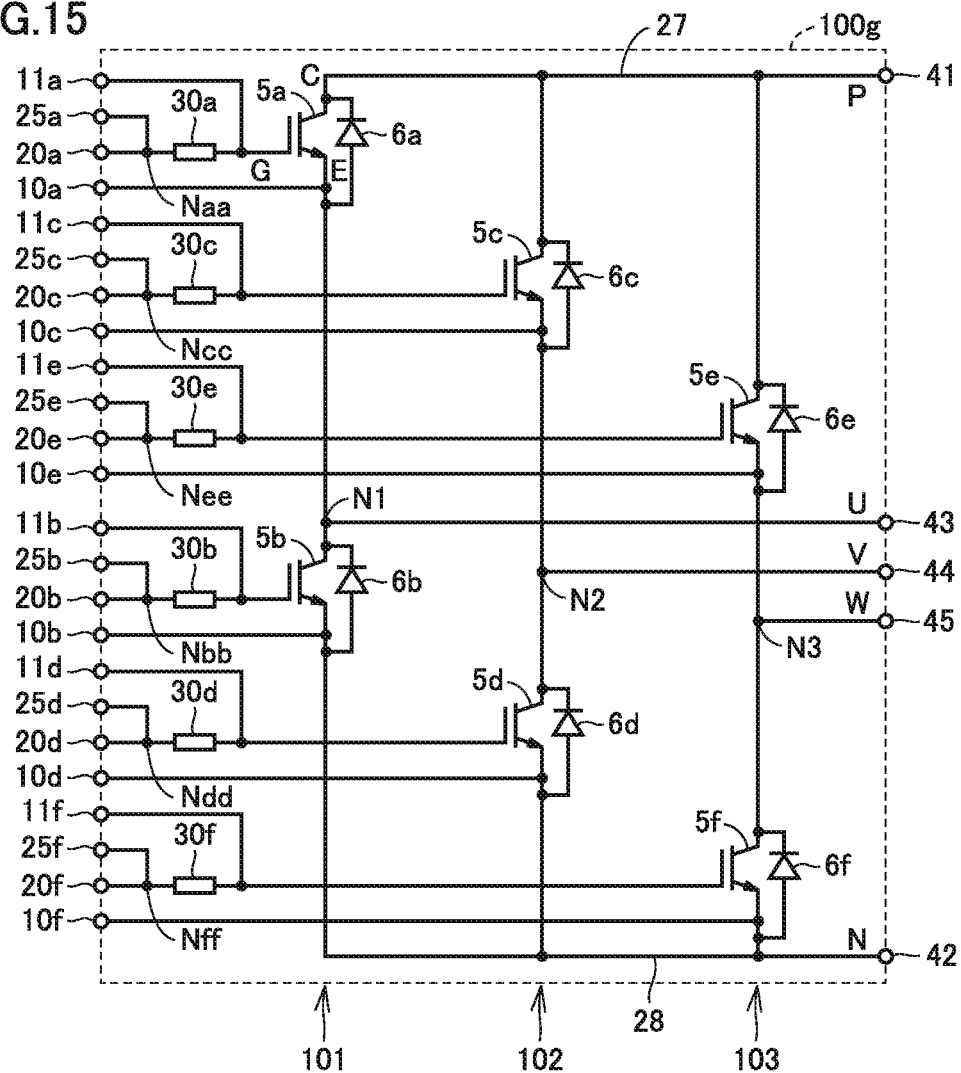
FIG. 15 is a circuit diagram illustrating a configuration of a power semiconductor device according to a fifth embodiment.

FIG. 15 is a circuit diagram illustrating a configuration of a power semiconductor device according to a fifth embodiment.

With FIG. 15 being compared with FIG. 4, a power semiconductor device 100g according to the fifth embodiment is different from power semiconductor device 100a according to the first embodiment in further including control terminals 25a to 25f Control terminals 25a to 25f are electrically connected to nodes Naa to Nff between control terminals 20a to 20f and built-in gate resistors 30a to 30f, respectively. Control terminals 20a to 20f and 25a to 25f are connected in parallel with respect to built-in gate resistors 30a to 30f, respectively. Since power semiconductor device 100g is otherwise the same in configuration as power semiconductor device 100a, detailed description will not be repeated.

In power semiconductor device 100g as well, control terminals 20a to 20f correspond to the "first control terminal," control terminals 11a to 11f correspond to the "second control terminal," and built-in gate resistors 30a to 30f correspond to the "first built-in resistor." Control terminals 25a to 25f correspond to the "third control terminal."

Figure 16:
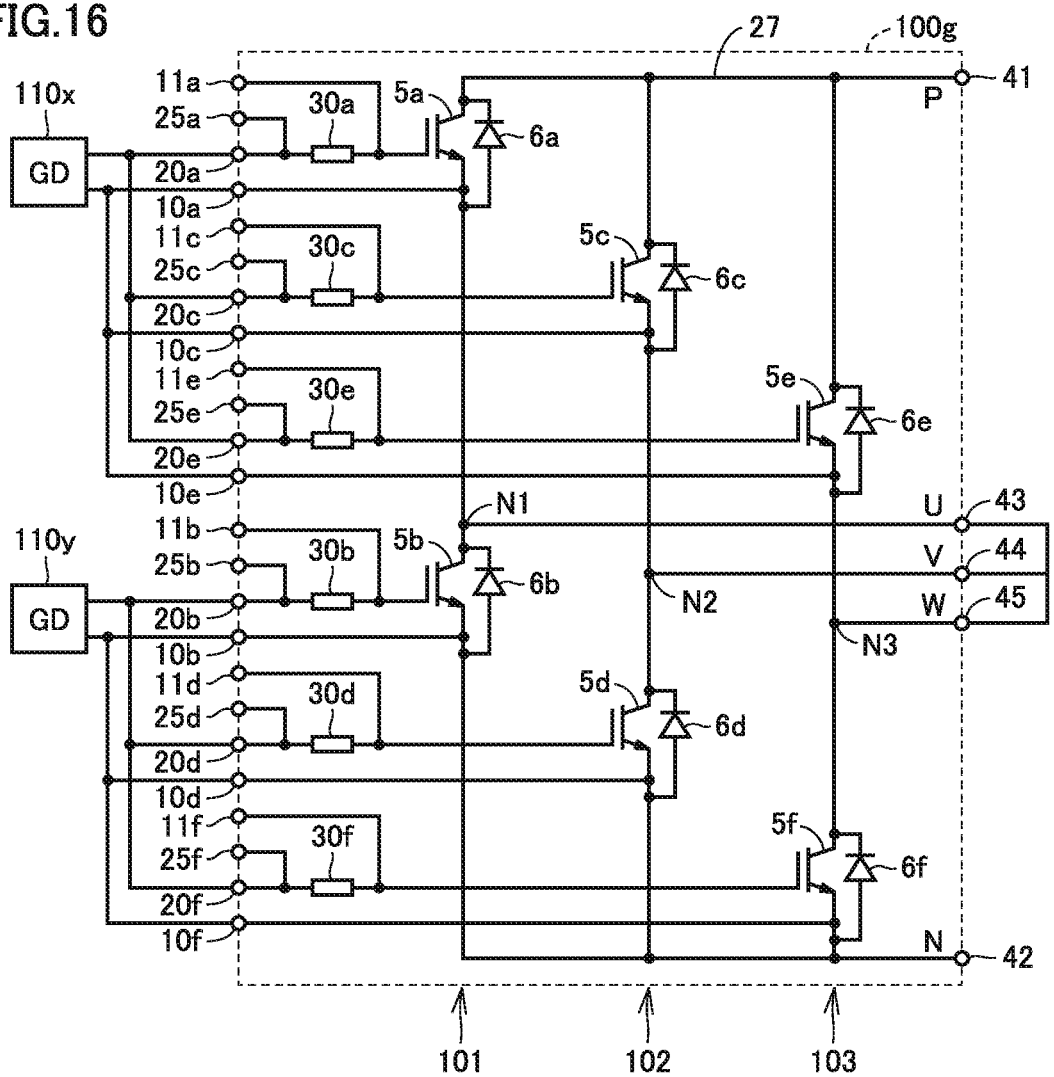
FIG. 16 is a circuit diagram of a drive system configured in use in parallel connection of the power semiconductor device according to the fifth embodiment.

FIG. 16 shows a circuit diagram of a drive system implemented in use in parallel connection of power semiconductor device 100g according to the fifth embodiment.

Referring to FIG. 16, in the drive system in use in parallel connection, semiconductor elements 5a, 5c, and 5e in the upper arm have terminals 10a, 10c, and 10e and control terminals 20a, 20c, and 20e connected to drive device 110x as in FIG. 6. Similarly, semiconductor elements 5b, 5d, and 5f in the lower arm have terminals 10b, 10d, and 10f and control terminals 20b, 20d, and 20f connected to drive device 110y.

Therefore, in use in parallel connection, built-in gate resistor 30 having an electrical resistance value the same as in the first embodiment sets a gate resistance for suppressing occurrence of imbalance in current among a plurality of semiconductor elements connected in parallel.

Figure 17:
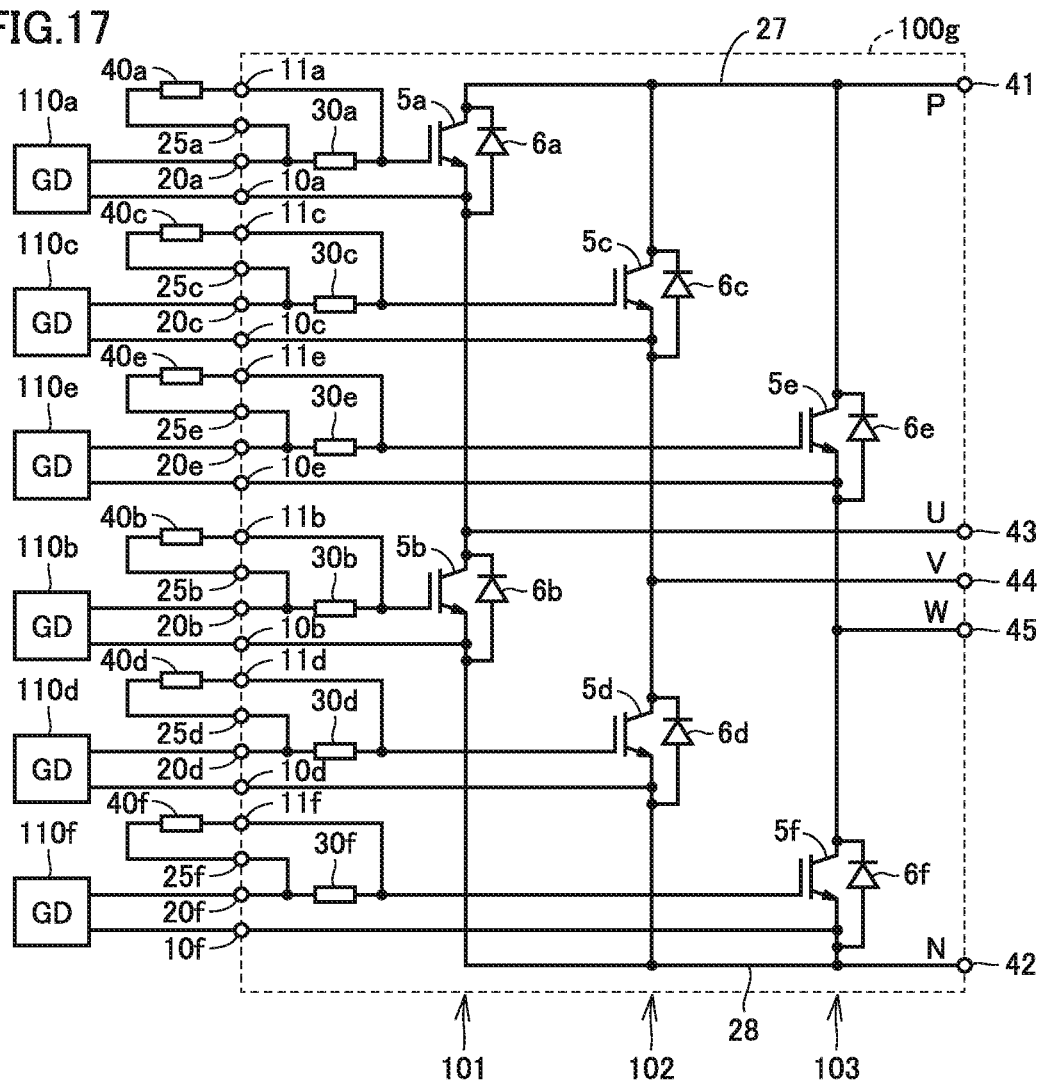
FIG. 17 is a circuit diagram of a drive system configured in individual use of the power semiconductor device according to the fifth embodiment.

FIG. 17 shows a circuit diagram of a drive system implemented in individual use of power semiconductor device 100g according to the fifth embodiment.

Referring to FIG. 17, in the drive system in individual use, drive devices 110a to 110f are connected to terminals 10a to 10f and control terminals 20a to 20f of semiconductor elements 5a to 5f, respectively as in FIG. 5. In individual use, on the outside of power semiconductor device 100f, resistive elements 40a to 40f are further connected between control terminals 25a to 25f and control terminals 11a to 11f, respectively. Resistive elements 40a to 40f correspond to the "external resistive element."

In individual use, a gate resistor of each semiconductor element 5 is implemented by connection in parallel to resistive element 40 externally connected to built-in gate resistor 30. Therefore, an electrical resistance value of externally connected resistive element 40 can be set similarly to the electrical resistance value of built-in gate resistor 35 in the fourth embodiment. Thus, an electrical resistance value owing to connection in parallel to resistive element 40 externally connected to built-in gate resistor 30 can be set to an optimal value for a gate resistance in individual use.

In power semiconductor device 100g according to the fifth embodiment, in both of use in parallel connection and individual use, each semiconductor element 5 has control terminal 20 and terminal 10 connected to drive device 110. A state of line connection between drive device 110 and power semiconductor device 100g is common between use in parallel connection and individual use, and switching between use in parallel connection and individual use can be made based on whether or not to externally connect resistive element 40.

Thus, in power semiconductor device 100g according to the fifth embodiment, in both of use in parallel connection and individual use shown in FIGS. 16 and 17, a gate resistance can be set as in the fourth embodiment. Under such a condition that a state of line connection between drive device 110 and semiconductor element 5 is common, switching between use in parallel connection and individual use can be made more readily than in the fourth embodiment depending on whether or not to connect an external resistor between control terminals 11 and 25 to which drive device 110 is not connected. Consequently, convenience of a user can be improved.

Figure 23:
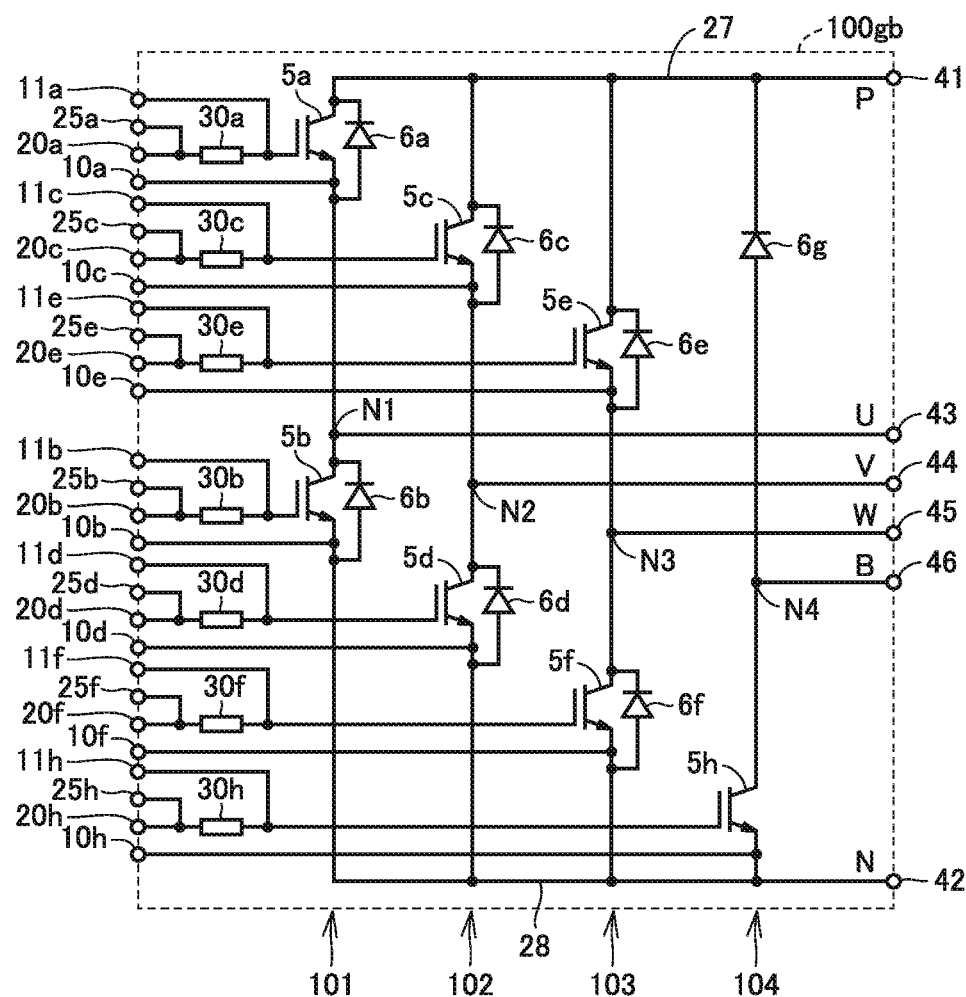
FIG. 23 is a circuit diagram illustrating a configuration of a power semiconductor device according to a combination of the second modification of the first embodiment and the fifth embodiment.

The fifth embodiment can also be combined with the configuration in the first and second modifications of the first embodiment by arranging control terminals 25a to 25f as in FIG. 15. For example, as in a power semiconductor device 100gb shown in FIG. 23, built-in gate resistor 30h and control terminals 11h, 20h, and 25h can be provided similarly to FIG. 15 for the control electrode (gate) of semiconductor element 5h of power semiconductor device 100b shown in FIG. 8.

In the second to fifth embodiments as well as the combinations between the second to fifth embodiments and the first and second modifications of the first embodiment, semiconductor element 5 and freewheeling diode 6 can be replaced with semiconductor element 7 (FIG. 9) implemented by a MOSFET or a monolithic reverse conducting IGBT as in the third modification of the first embodiment.

Though an example in which the configuration for adapting to use in parallel connection is applied in common to a semiconductor element of each phase circuit is described in the first to fifth embodiments described above, the configuration according to the present embodiment can also be applied only to some of the plurality of phase circuits.

Figure 18:
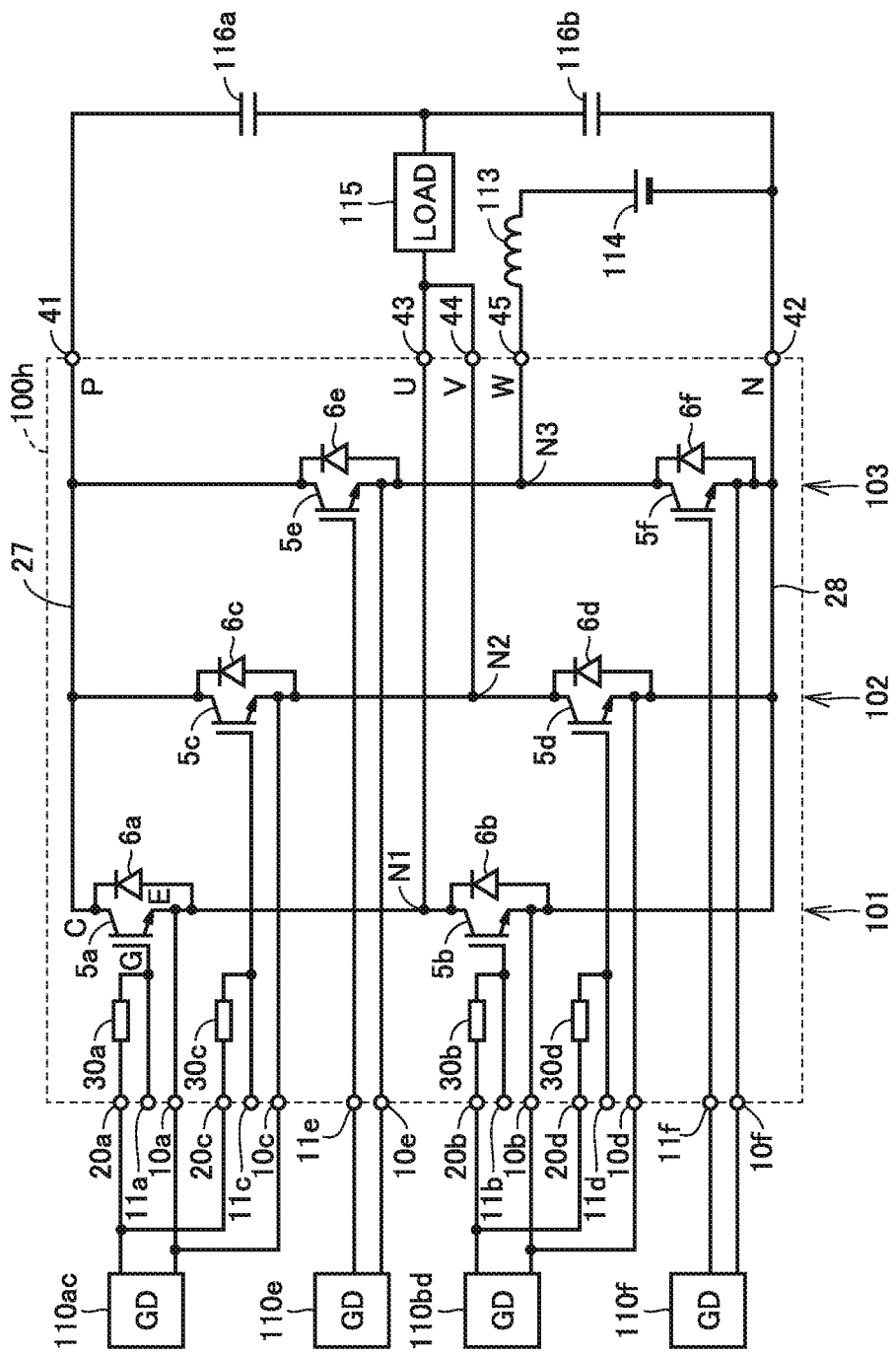
FIG. 18 is a circuit diagram illustrating a modification of the power semiconductor device according to the present embodiment.

For example, as in a power semiconductor device 100h shown as a modification in FIG. 18, the first modification (power semiconductor device 100a) of the first embodiment shown in FIG. 7 can also be configured such that semiconductor elements 5e and 5f of W-phase circuit 103 are not used in parallel connection but only terminals 10e and 10f and control terminals 11e and 11f are provided and control terminal 20 and built-in gate resistor 30 are not arranged as in the comparative example (FIG. 1). In power semiconductor device 100h in FIG. 18, U-phase circuit 101 and V-phase circuit 102 correspond to the "plurality of first phase circuits."

The power semiconductor device to which the present embodiment is applied can be configured otherwise in an arbitrary manner so long as a plurality of "first phase circuits" configured for use in parallel connection according to the first to fifth embodiments are arranged in parallel.

Though embodiments of the present invention have been described, it should be understood that the embodiments disclosed herein are illustrative and non-restrictive in every respect. The scope of the present invention is defined by the terms of the claims and is intended to include any modifications within the scope and meaning equivalent to the terms of the claims.

What is claimed is:

1. A power semiconductor device comprising:
   a plurality of first phase circuits connected in parallel between first and second power supply lines,
   each of the plurality of first phase circuits including first and second semiconductor elements connected in series between the first and second power supply lines with a first output node being interposed,
   the first and second semiconductor elements each including a control electrode and first and second main electrodes and being configured to render the first and second main electrodes electrically conducting or non-conducting in accordance with a voltage at the control electrode;
   first and second control terminals for input of a voltage pulse signal from outside of the power semiconductor device in each of the plurality of first phase circuits, the first and second control terminals being provided in correspondence with each of the first and second semiconductor elements, the voltage pulse signal being configured to be set to a voltage level different between an on period and an off period of a respective semiconductor element and configured to be transmitted via one of the first and second control terminal,
   the first and second control terminals being electrically connected to the same control electrode of a corresponding semiconductor element of the first semiconductor element, or electrically connected to the same control electrode of a corresponding semiconductor element of the second semiconductor element, and
   the first and second control terminals are led out from the connection to the same control electrode of the corresponding semiconductor element of the first semiconductor element independently from one another to the outside of the device, or the first and second control terminals are led out from the connection to the same control electrode of the corresponding semiconductor element of the second semiconductor element independently from one another to the outside of the device; and
   a first built-in resistor electrically connected between the first control terminal and the control electrode in each of the plurality of first phase circuits.

2. The power semiconductor device according to claim 1, the power semiconductor device further comprising a second built-in resistor electrically connected between the second control terminal and the control electrode in each of the plurality of first phase circuits.

3. The power semiconductor device according to claim 2, the power semiconductor device further comprising a second phase circuit connected in parallel to the plurality of first phase circuits between the first and second power supply lines, wherein the second phase circuit includes a rectifying element and a third semiconductor element connected in series with a second output node being interposed, and the first and second control terminals and the first and second built-in resistors are arranged for the third semiconductor element as in the first and second semiconductor elements of the first phase circuits.

4. A power semiconductor drive system comprising:

the power semiconductor device according to claim 2; and a drive device for respectively generating the voltage pulse signal for turning on and off the first and second semiconductor elements of the plurality of first phase circuits, the drive device individually inputting the voltage pulse signals to each of the first and second control terminals of each first semiconductor element and the first and second control terminals of each second semiconductor element of the plurality of first phase circuits.

5. The power semiconductor device according to claim 1, the power semiconductor device further comprising a second built-in resistor electrically connected between the second control terminal and the control electrode in each of the plurality of first phase circuits, wherein the first built-in resistor is electrically connected between a node between the second control terminal and the second built-in resistor and the first control terminal.

6. The power semiconductor device according to claim 1, the power semiconductor device further comprising a second phase circuit connected in parallel to the plurality of first phase circuits between the first and second power supply lines, wherein the second phase circuit includes a rectifying element and a third semiconductor element connected in series with a second output node being interposed, and the first and second control terminals and the first built-in resistor are arranged for the third semiconductor element as in the first and second semiconductor elements of the first phase circuits.

7. A power semiconductor drive system comprising:

the power semiconductor device according to claim 6; and a drive device for respectively generating the voltage pulse signal for turning on and off the first and second semiconductor elements of the plurality of first phase circuits and the third semiconductor element of the second phase circuit, the drive device individually inputting the voltage pulse signals to the second control terminal of each of each first semiconductor element, each second semiconductor element, and the third semiconductor element.

8. A power semiconductor drive system comprising:

the power semiconductor device according to claim 1; and a drive device for respectively generating the voltage pulse signal for turning on and off the first and second semiconductor elements of the plurality of first phase circuits, the drive device individually inputting the voltage pulse signals to the second control terminal of the first and second semiconductor elements of each of the plurality of first phase circuits.

9. A power semiconductor drive system comprising:

the power semiconductor device according to claim 1; and a drive device for respectively generating the voltage pulse signal for turning on and off the first and second semiconductor elements of the plurality of first phase circuits, the first output nodes of at least some of the plurality of first phase circuits of the power semiconductor device are interconnected, and the drive device commonly inputting a first of the voltage pulse signals to the first control terminals of the first semiconductor elements of a plurality of number of the first phase circuits in which the first output nodes are interconnected among the plurality of first phase circuits, and commonly inputting a second of the voltage pulse signals to the first control terminals of the second semiconductor elements of the plurality of number of the first phase circuits.

10. A power semiconductor device comprising:

a plurality of first phase circuits connected in parallel between first and second power supply lines, each of the plurality of first phase circuits including first and second semiconductor elements connected in series between the first and second power supply lines with a first output node being interposed, the first and second semiconductor elements each including a control electrode and first and second main electrodes and being configured to render the first and second main electrodes electrically conducting or non-conducting in accordance with a voltage at the control electrode;

first and second control terminals for input of a voltage pulse signal from outside of the power semiconductor device in each of the plurality of first phase circuits, the first and second control terminals being provided in correspondence with each of the first and second semiconductor elements, the voltage pulse signal being configured to be set to a voltage level different between an on period and an off period of a respective semiconductor element and configured to be transmitted via one of the first and second control terminal, the first and second control terminals being electrically connected to the same control electrode of a corresponding semiconductor element of the first semiconductor element, or electrically connected to the same control electrode of a corresponding semiconductor element of the second semiconductor element;

a first built-in resistor electrically connected between the first control terminal and the control electrode in each of the plurality of first phase circuits; and a second built-in resistor electrically connected between the second control terminal and the control electrode in each of the plurality of first phase circuits, wherein the first built-in resistor is higher in electrical resistance value than the second built-in resistor.

11. A power semiconductor device comprising:

a plurality of first phase circuits connected in parallel between first and second power supply lines, each of the plurality of first phase circuits including first and second semiconductor elements connected in series between the first and second power supply lines with a first output node being interposed, the first and second semiconductor elements each including a control electrode and first and second main electrodes and being configured to render the first and second main electrodes electrically conducting or non-conducting in accordance with a voltage at the control electrode;

first and second control terminals for input of an electrical signal from outside of the power semiconductor device in each of the plurality of first phase circuits, the first and second control terminals being provided in correspondence with each of the first and second semiconductor elements, the first and second control terminals being electrically connected to the control electrode of a corresponding semiconductor element of the first and second semiconductor elements;

a first built-in resistor electrically connected between the first control terminal and the control electrode in each of the plurality of first phase circuits; and a third control terminal for input of the electrical signal from the outside of the power semiconductor device in each of the plurality of first phase circuits, the third control terminal being provided in correspondence with each of the first and second semiconductor elements, wherein the third control terminal is electrically connected to a node between the first control terminal and the first built-in resistor in inside of the power semiconductor device.

12. The power semiconductor device according to claim 11, the power semiconductor device further comprising a second phase circuit connected in parallel to the plurality of first phase circuits between the first and second power supply lines, wherein the second phase circuit includes a rectifying element and a third semiconductor element connected in series with a second output node being interposed, and the first, second, and third control terminals and the first built-in resistor are arranged for the third semiconductor element as in the first and second semiconductor elements of the first phase circuits.

13. A power semiconductor drive system comprising:

the power semiconductor device according to claim 11;

a drive device for respectively generating the voltage pulse signal for turning on and off the first and second semiconductor elements of the plurality of first phase circuits, the drive device individually inputting the voltage pulse signals to the first control terminals of the first and second semiconductor elements of each of the plurality of first phase circuits; and an external resistive element electrically connected between the second and third control terminals on outside of the power semiconductor device in correspondence with each first semiconductor element and each second semiconductor element.

14. A power semiconductor drive system comprising:

a power semiconductor device comprising:

a plurality of first phase circuits connected in parallel between first and second power supply lines, each of the plurality of first phase circuits including first and second semiconductor elements connected in series between the first and second power supply lines with a first output node being interposed, the first and second semiconductor elements each including a control electrode and first and second main electrodes and being configured to render the first and second main electrodes electrically conducting or nonconducting in accordance with a voltage at the control electrode;

first and second control terminals for input of a voltage pulse signal from outside of the power semiconductor device in each of the plurality of first phase circuits, the first and second control terminals being provided in correspondence with each of the first and second semiconductor elements, the first and second control terminals being electrically connected to the same control electrode of a corresponding semiconductor element of the first semiconductor element, or electrically connected to the same control electrode of a corresponding semiconductor element of the second semiconductor element;

a first built-in resistor electrically connected between the first control terminal and the control electrode in each of the plurality of first phase circuits; and a second phase circuit connected in parallel to the plurality of first phase circuits between the first and second power supply lines, wherein the second phase circuit includes a rectifying element and a third semiconductor element connected in series with a second output node being interposed, and the first and second control terminals and the first built-in resistor are arranged for the third semiconductor element as in the first and second semiconductor elements of the first phase circuits; and a drive device for respectively generating the voltage pulse signal for turning on and off the first and second semiconductor elements of the plurality of first phase circuits and the third semiconductor element of the second phase circuit, the first output nodes of at least some of the plurality of first phase circuits of the power semiconductor device and the second output node of the second phase circuit being interconnected and the third semiconductor element being connected in parallel to the first or second semiconductor element, and the drive device commonly inputting a first of the voltage pulse signals to the first control terminals of the first semiconductor elements of a plurality of number of the first phase circuits in which the first output nodes are interconnected among the plurality of first phase circuits, commonly inputting a second of the voltage pulse signals to the first control terminals of the second semiconductor elements of the plurality of number of the first phase circuits, and further inputting to the first control terminal of the third semiconductor element, the first or second commonly input voltage pulse signal.

* * * * *